US010785863B2

(12) United States Patent
Trulli et al.

(10) Patent No.: US 10,785,863 B2
(45) Date of Patent: Sep. 22, 2020

(54) CIRCUIT SUPPORT AND COOLING STRUCTURE

(71) Applicant: Raytheon Company, Waltham, MA (US)

(72) Inventors: Susan C. Trulli, Lexington, MA (US); Christopher M. Laighton, Boxborough, MA (US)

(73) Assignee: Raytheon Company, Waltham, MA (US)

( * ) Notice: Subject to any disclaimer, the term of this patent is extended or adjusted under 35 U.S.C. 154(b) by 150 days.

(21) Appl. No.: 15/948,404

(22) Filed: Apr. 9, 2018

(65) Prior Publication Data

US 2019/0313522 A1    Oct. 10, 2019

(51) Int. Cl.
*H05K 1/02* (2006.01)
*H05K 1/18* (2006.01)
(Continued)

(52) U.S. Cl.
CPC ....... *H05K 1/0204* (2013.01); *H01L 21/4846* (2013.01); *H01L 21/4882* (2013.01); *H01L 21/56* (2013.01); *H01L 23/367* (2013.01); *H01L 23/3675* (2013.01); *H01L 23/373* (2013.01); *H01L 23/5386* (2013.01); *H01L 23/66* (2013.01); *H01L 25/0655* (2013.01); *H01L 25/165* (2013.01); *H01L 25/18* (2013.01); *H01L 25/50* (2013.01); *H03F 1/301* (2013.01); *H03F 3/195* (2013.01); *H03F 3/211* (2013.01); *H03F 3/213* (2013.01); *H05K 1/0243* (2013.01); *H05K 1/0271* (2013.01); *H05K 1/181* (2013.01); *H05K 3/1283* (2013.01); *H05K 3/34* (2013.01);
(Continued)

(58) Field of Classification Search
CPC .......... H03F 3/19; H03F 3/602; H05K 1/182; H05K 3/0061; H05K 2201/10454
See application file for complete search history.

(56) References Cited

U.S. PATENT DOCUMENTS 3,156,091 A    11/1964  Kraus
3,980,105 A     9/1976  Myskowski
(Continued)

FOREIGN PATENT DOCUMENTS

DE    10 2011 078 674 A1    1/2013
EP         1 783 833 A2    5/2007
(Continued)

OTHER PUBLICATIONS

Darwish et al.; Three Dimensional Transmission Lines and Power Divider Circuits. Apr. 1, 2009; 8 pages.
(Continued)

*Primary Examiner* — Jayprakash N Gandhi
*Assistant Examiner* — Michael A Matey
(74) *Attorney, Agent, or Firm* — Daly, Crowley, Mofford & Durkee, LLP

(57) ABSTRACT

A MMIC support and cooling structure having a three-dimensional, thermally conductive support structure having a plurality of surfaces and a circuit having a plurality of heat generating electrical components disposed on a first portion of the surfaces and interconnected by microwave transmission lines disposed on a second portion of the plurality of surfaces of the thermally conductive support structure.

5 Claims, 29 Drawing Sheets

(51) Int. Cl.

| | |
|---|---|
| H01L 23/66 | (2006.01) |
| H01L 23/367 | (2006.01) |
| H01L 25/065 | (2006.01) |
| H01L 25/00 | (2006.01) |
| H05K 3/12 | (2006.01) |
| H01L 23/538 | (2006.01) |
| H01L 21/48 | (2006.01) |
| H03F 3/195 | (2006.01) |
| H03F 3/21 | (2006.01) |
| H03F 3/213 | (2006.01) |
| H01L 25/16 | (2006.01) |
| H01L 21/56 | (2006.01) |
| H05K 3/34 | (2006.01) |
| H01L 25/18 | (2006.01) |
| H03F 1/30 | (2006.01) |
| H01L 23/373 | (2006.01) |
| H01P 3/08 | (2006.01) |
| H01P 11/00 | (2006.01) |
| H01L 23/42 | (2006.01) |

(52) U.S. Cl.
CPC ......... *H01L 23/3736* (2013.01); *H01L 23/42* (2013.01); *H01L 2223/6627* (2013.01); *H01L 2223/6644* (2013.01); *H01L 2223/6683* (2013.01); *H01P 3/081* (2013.01); *H01P 11/003* (2013.01); *H03F 2200/255* (2013.01); *H03F 2200/33* (2013.01); *H03F 2200/423* (2013.01); *H05K 2201/066* (2013.01); *H05K 2201/068* (2013.01); *H05K 2201/09063* (2013.01); *H05K 2201/09227* (2013.01); *H05K 2201/10166* (2013.01); *H05K 2201/10174* (2013.01); *H05K 2201/10378* (2013.01)

(56) References Cited

U.S. PATENT DOCUMENTS

| | | | |
|---|---|---|---|
| 4,057,610 A | 11/1977 | Goettler et al. | |
| 4,627,472 A | 12/1986 | Goettler et al. | |
| 4,672,472 A | 6/1987 | Sugiyama | |
| 5,241,450 A * | 8/1993 | Bernhardt | H01L 23/473 257/712 |
| 5,434,362 A * | 7/1995 | Klosowiak | H05K 1/028 174/254 |
| 5,545,924 A * | 8/1996 | Contolatis | H01L 23/66 257/724 |
| 6,075,701 A | 6/2000 | Ali et al. | |
| 6,387,462 B1 | 5/2002 | Blain et al. | |
| 6,674,347 B1 | 1/2004 | Maruhashi et al. | |
| 6,717,813 B1 | 4/2004 | Garner | |
| 7,005,584 B2 * | 2/2006 | Levi | H05K 1/14 174/254 |
| 7,303,005 B2 | 12/2007 | Reis et al. | |
| 9,093,442 B1 * | 7/2015 | Huynh | H01L 23/473 |
| 9,318,450 B1 | 4/2016 | Reza et al. | |
| 9,889,624 B2 | 2/2018 | Trulli | |
| 9,978,698 B1 * | 5/2018 | Trulli | H01P 5/028 |
| 10,232,582 B2 | 3/2019 | Trulli | |
| 2002/0006523 A1 | 1/2002 | Obeshaw | |
| 2002/0167800 A1 | 11/2002 | Smalc | |
| 2003/0042153 A1 | 3/2003 | Farrar et al. | |
| 2003/0116312 A1 | 6/2003 | Krassowski et al. | |
| 2006/0096740 A1 | 5/2006 | Zheng | |
| 2007/0053168 A1 | 3/2007 | Sayir et al. | |
| 2007/0115076 A1 * | 5/2007 | Khazanov | H01P 1/127 333/105 |
| 2007/0262836 A1 * | 11/2007 | Voss | H01P 3/081 333/247 |
| 2009/0066420 A1 * | 3/2009 | Lopez | H03F 3/19 330/286 |
| 2009/0091892 A1 * | 4/2009 | Otsuka | H02M 7/003 361/715 |
| 2010/0177796 A1 | 7/2010 | Miller | |
| 2011/0030924 A1 | 2/2011 | Kawabata et al. | |
| 2012/0063097 A1 * | 3/2012 | Reza | H01L 23/36 361/720 |
| 2013/0092354 A1 | 4/2013 | Semenov et al. | |
| 2013/0208434 A1 * | 8/2013 | Alm | H01L 23/66 361/783 |
| 2013/0271905 A1 * | 10/2013 | Sullivan | G06F 1/16 361/679.02 |
| 2015/0062802 A1 | 3/2015 | Grunow et al. | |
| 2016/0316570 A1 * | 10/2016 | De Vaan | H05K 1/0284 |
| 2017/0042058 A1 * | 2/2017 | Pope | H05K 7/205 |
| 2017/0100907 A1 | 4/2017 | Trulli | |
| 2017/0284647 A1 * | 10/2017 | Morin | F21V 29/70 |
| 2017/0325332 A1 * | 11/2017 | Long | H05K 1/144 |
| 2019/0295918 A1 | 9/2019 | Trulli et al. | |

FOREIGN PATENT DOCUMENTS

| | | |
|---|---|---|
| EP | 1 783 833 A3 | 1/2009 |
| JP | 2001-267441 A | 9/2001 |
| WO | WO 2011/008467 A1 | 1/2011 |

OTHER PUBLICATIONS

Gries; Photonics Applied: Microelectronics Processing: Laser direct structuring creates low-cost 3D integrated circuits. Oct. 10, 2010; 6 pages.
Tehrani et al.; Inkjet-Printed 3D Interconnects for Millimeter-Wave System-on-Package Solutions. 2016 IEEE MTT-S International Microwave Symposium (IMS), San Francisco, CA; Jan. 1, 2016; 4 pages.
Notification of Transmittal of the International Search Report and the Written Opinion of the ISA dated Jul. 2, 2019 for International Application No. PCT/US2019/023988; 1 Page.
International Search Report dated Jul. 2, 2019 for International Application No. PCT/US2019/023988; 5 Pages.
Written Opinion of the ISA dated Jul. 2, 2019 for International Application No. PCT/US2019/023988; 12 Pages.
Final Office Action dated Dec. 10, 2019 for U.S. Appl. No. 15/935,622, 15 pages.
Supplemental Response to Final Office Action with RCE dated Dec. 13, 2019 for U.S. Appl. No. 15/935,622, 19 pages.
PCT International Search Report and Written Opinion dated Jan. 9, 2017 for International Application No. PCT/US2016/054290; 9 pages.
Whelan, et al.; GaN Technology for Radars. CS MANTECH Conference, Apr. 23-26, 2012, Boston, Massachusetts, USA. 4 pages.
Final Office Action dated Sep. 28, 2018 for U.S. Appl. No. 15/870,155; 10 Pages.
Terminal Disclaimer and Response to Office Action dated Sep. 28, 2018 for U.S. Appl. No. 15/870,155, filed Oct. 4, 2018; 11 Pages.
PCT Invitation to Pay Additional Fees and Partial Search Report dated Oct. 18, 2019 for International Application No. PCT/US2019/016282; 16 Pages.

* cited by examiner

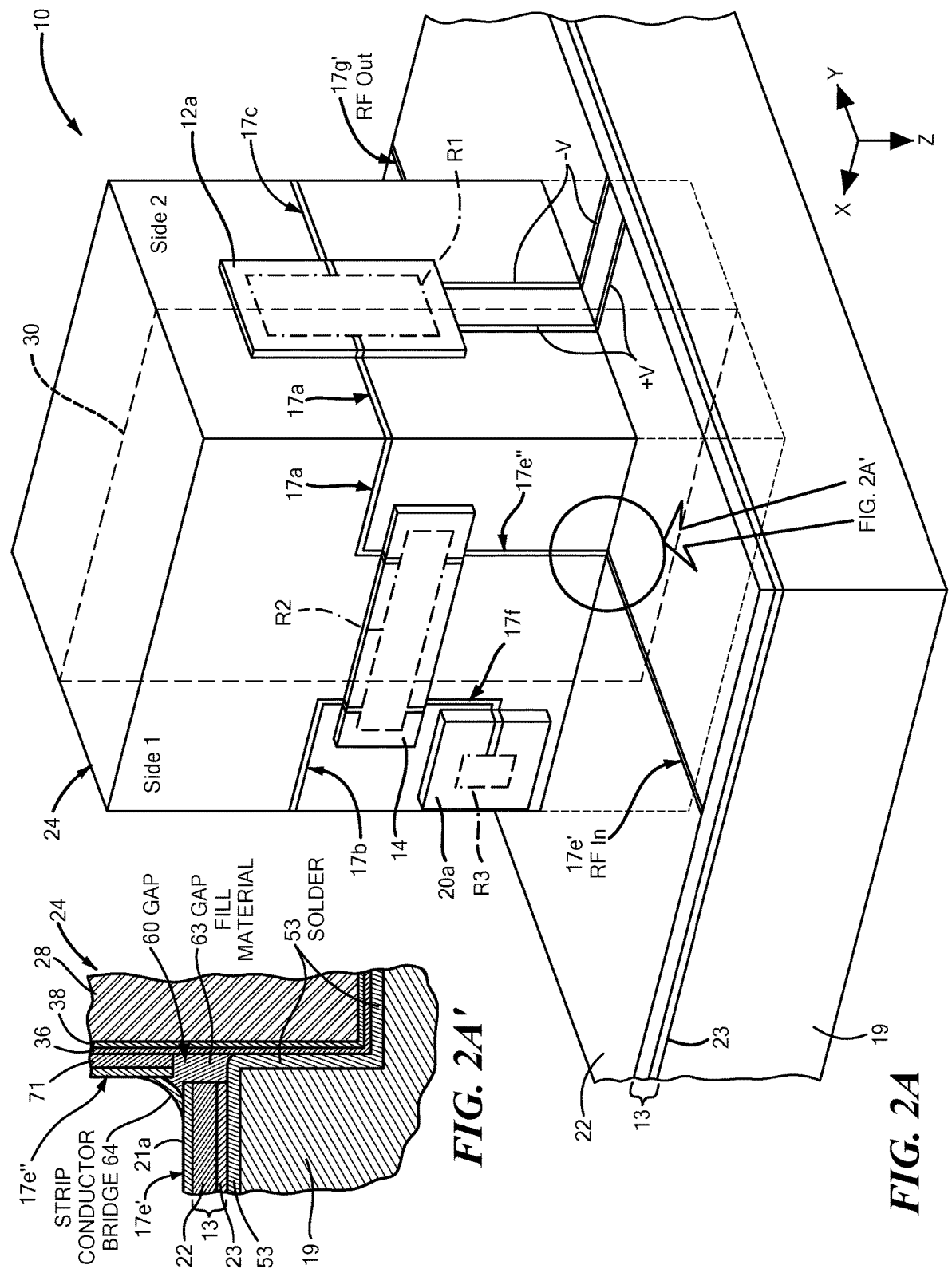

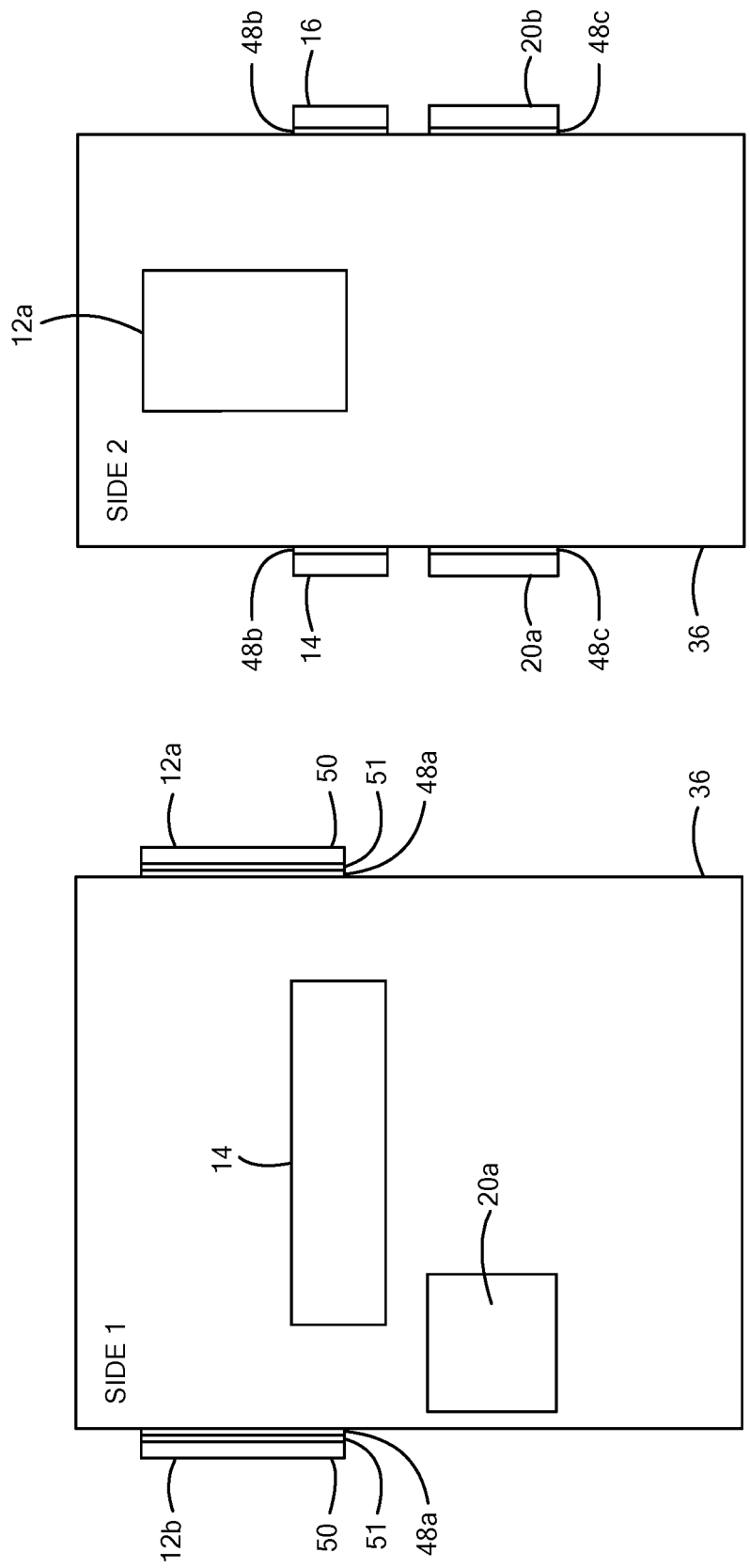

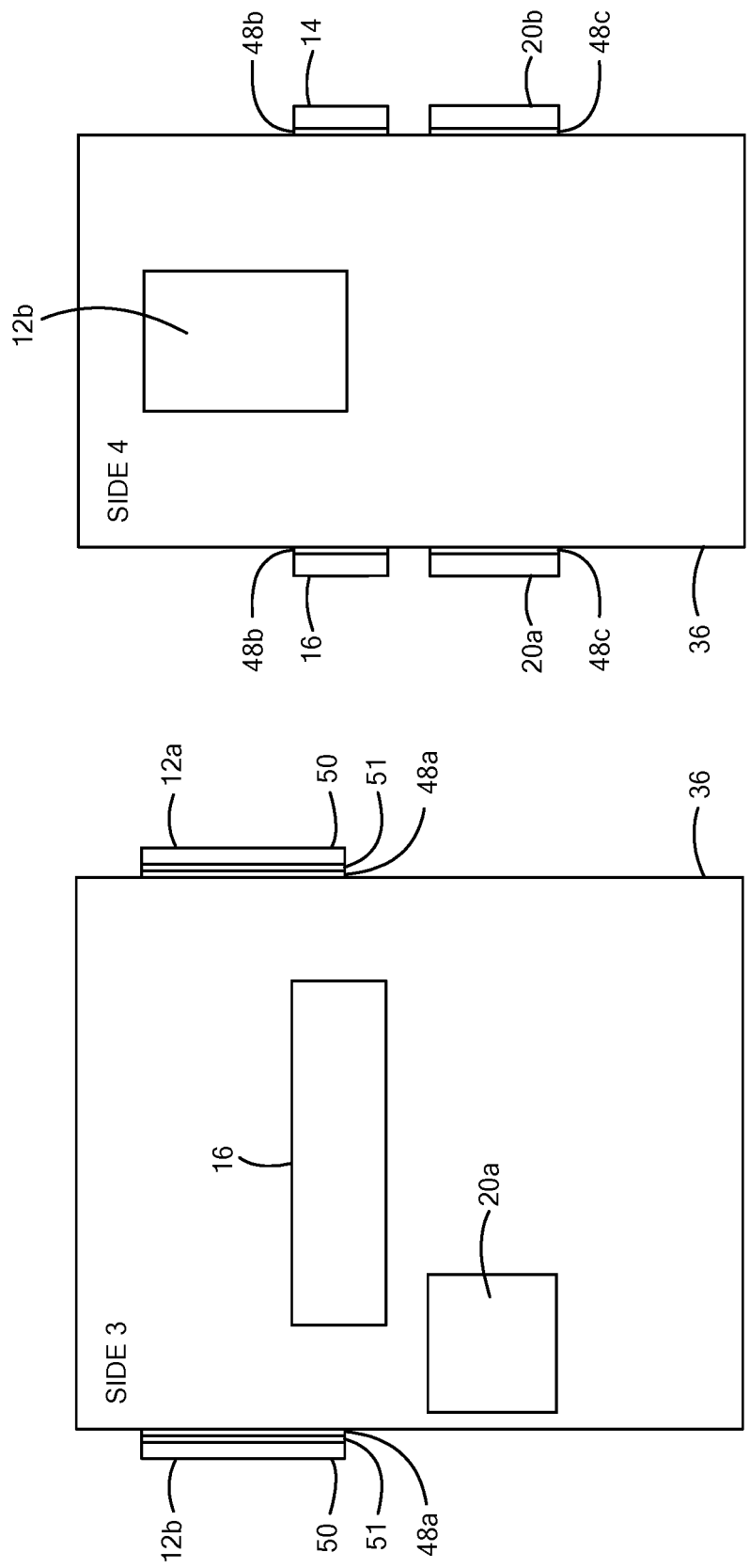

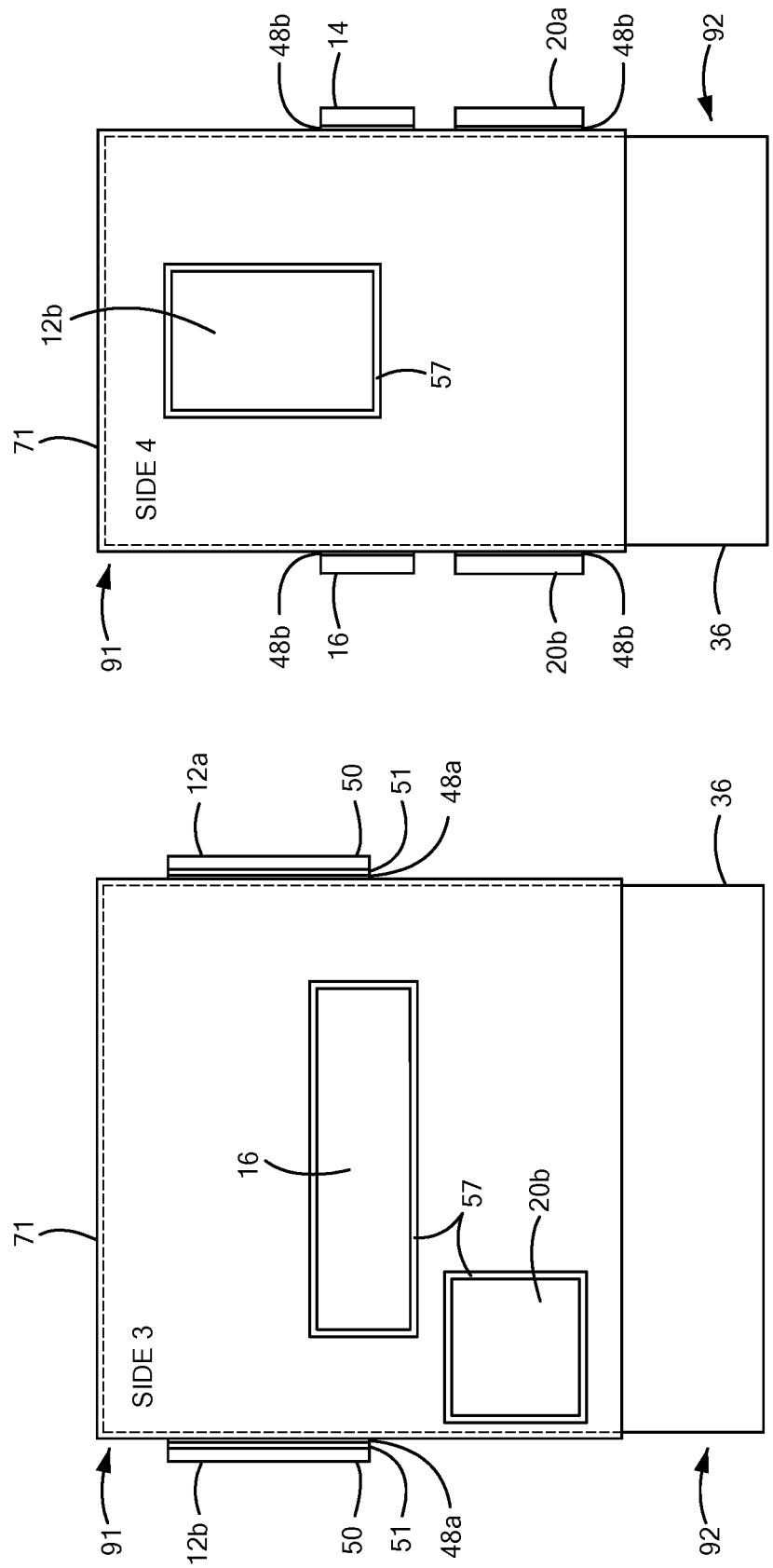

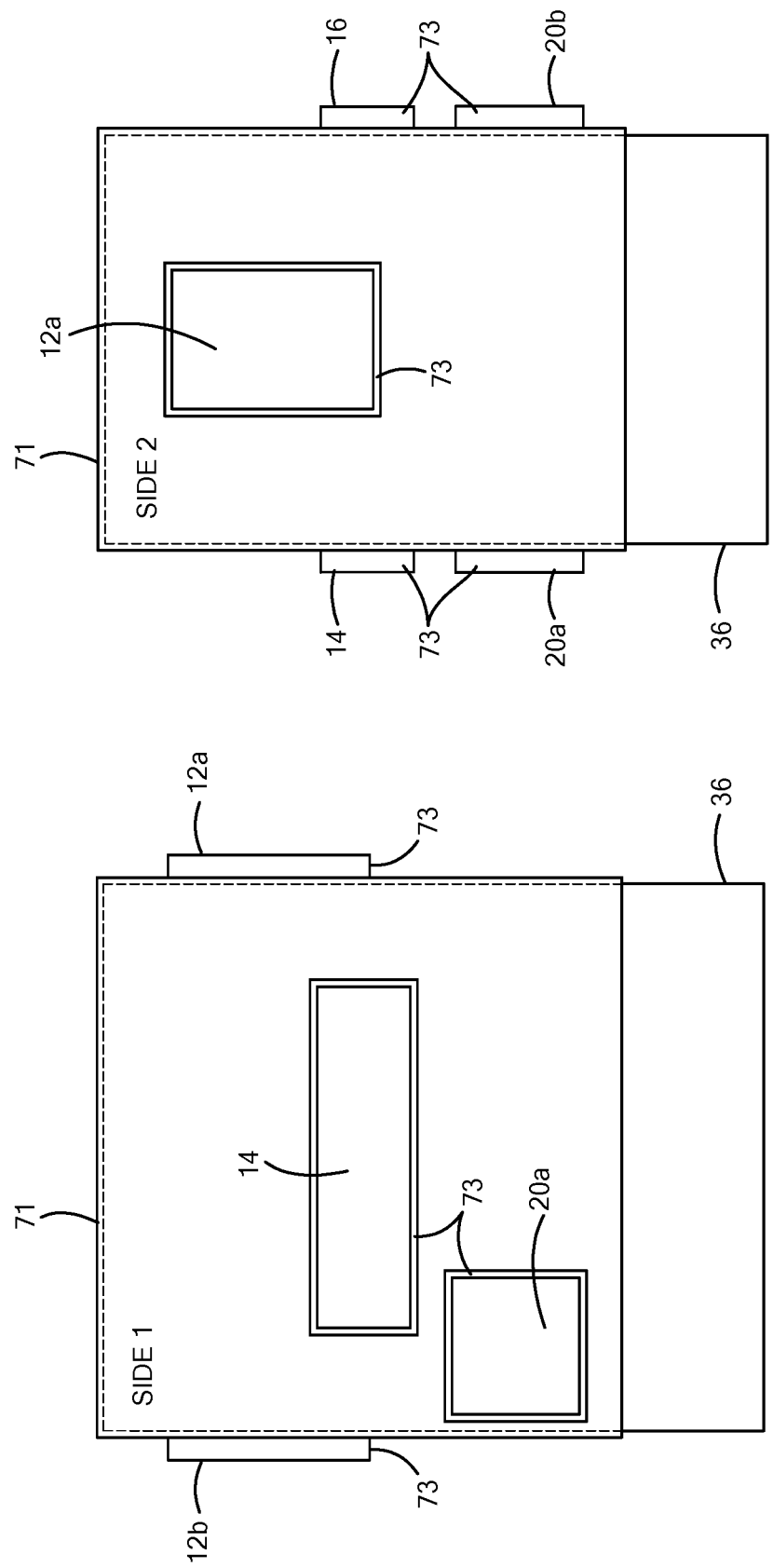

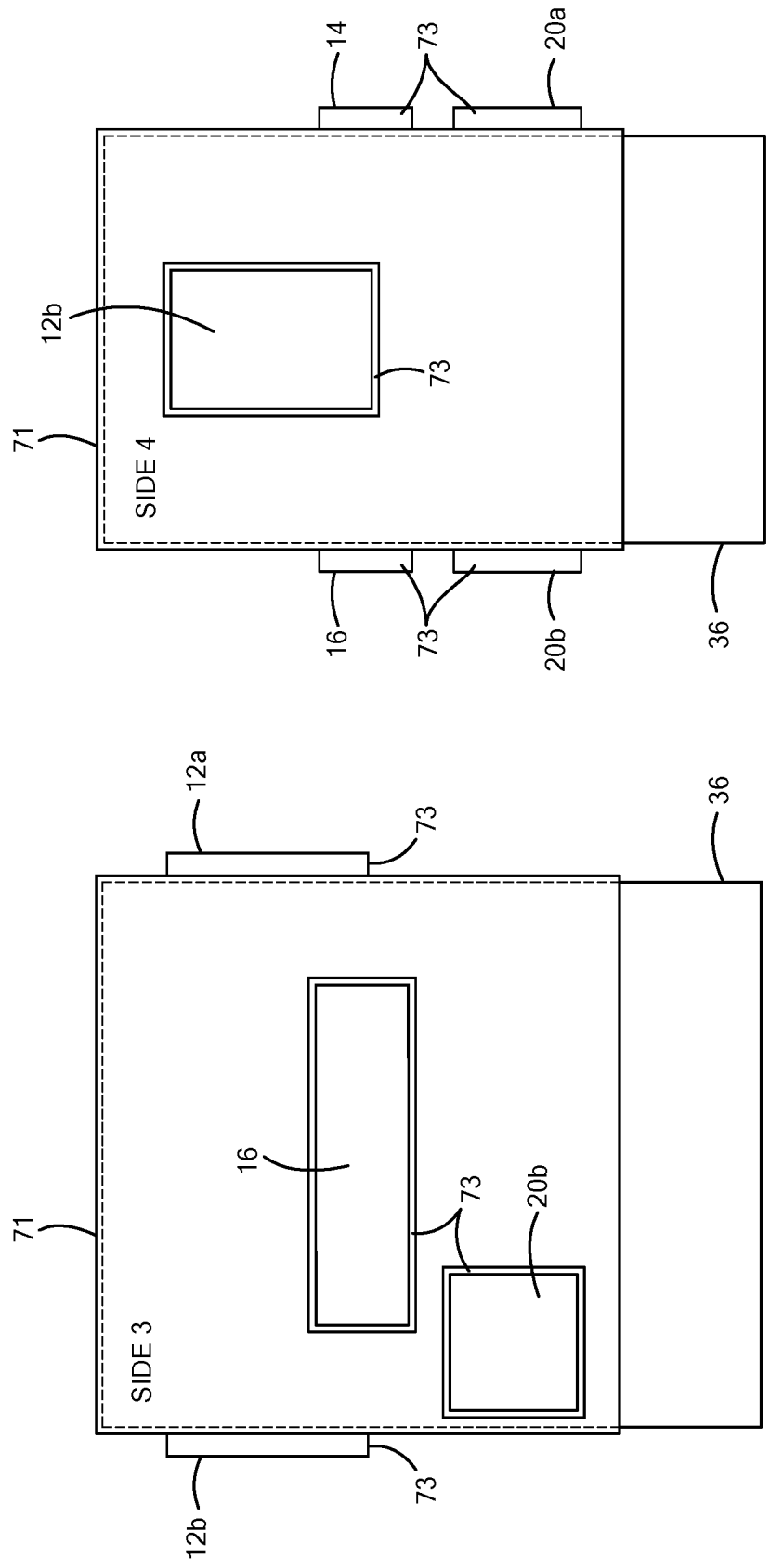

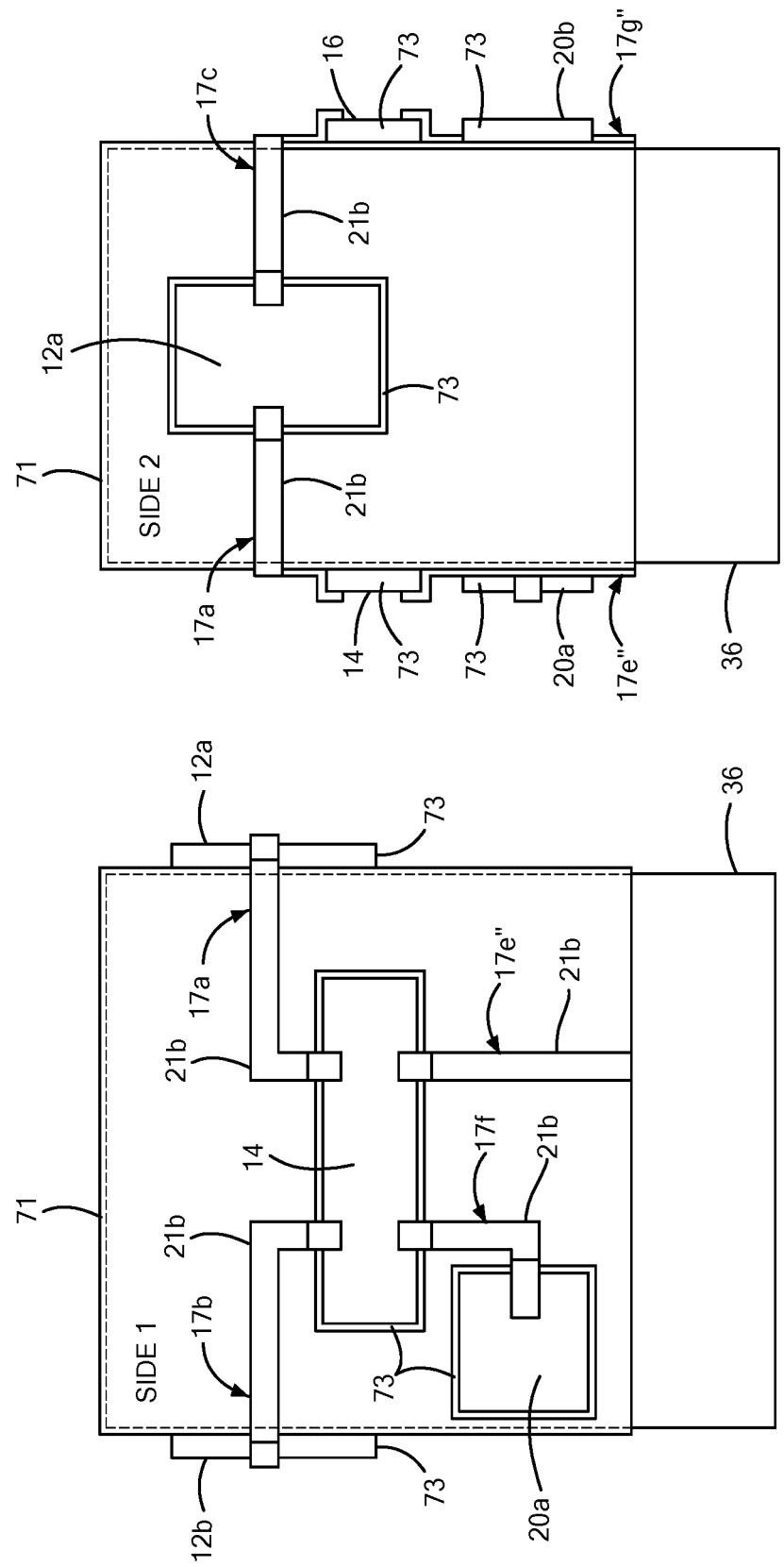

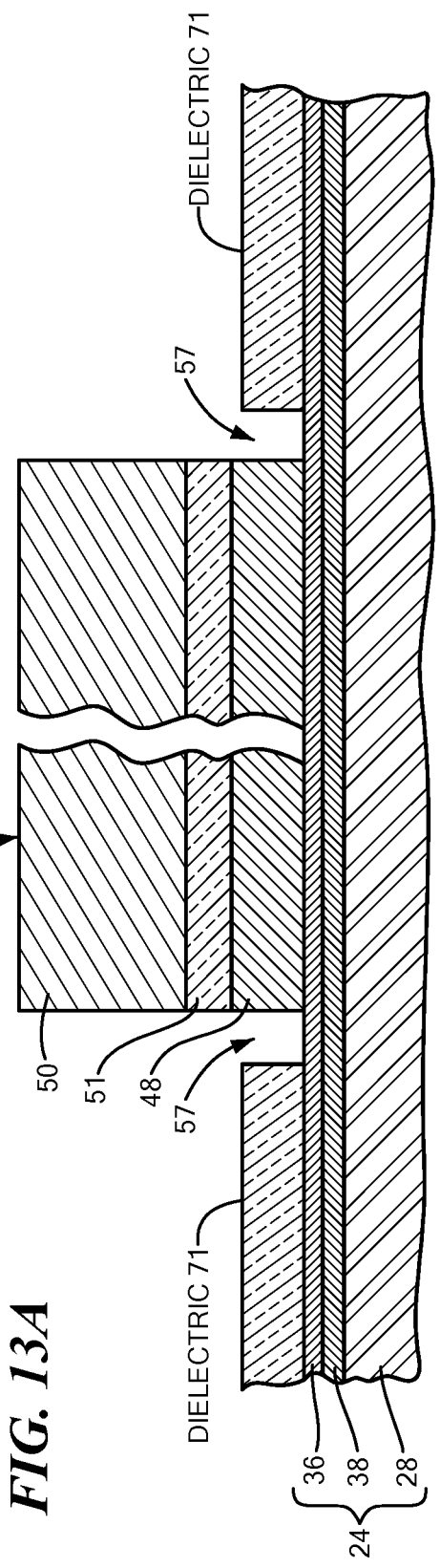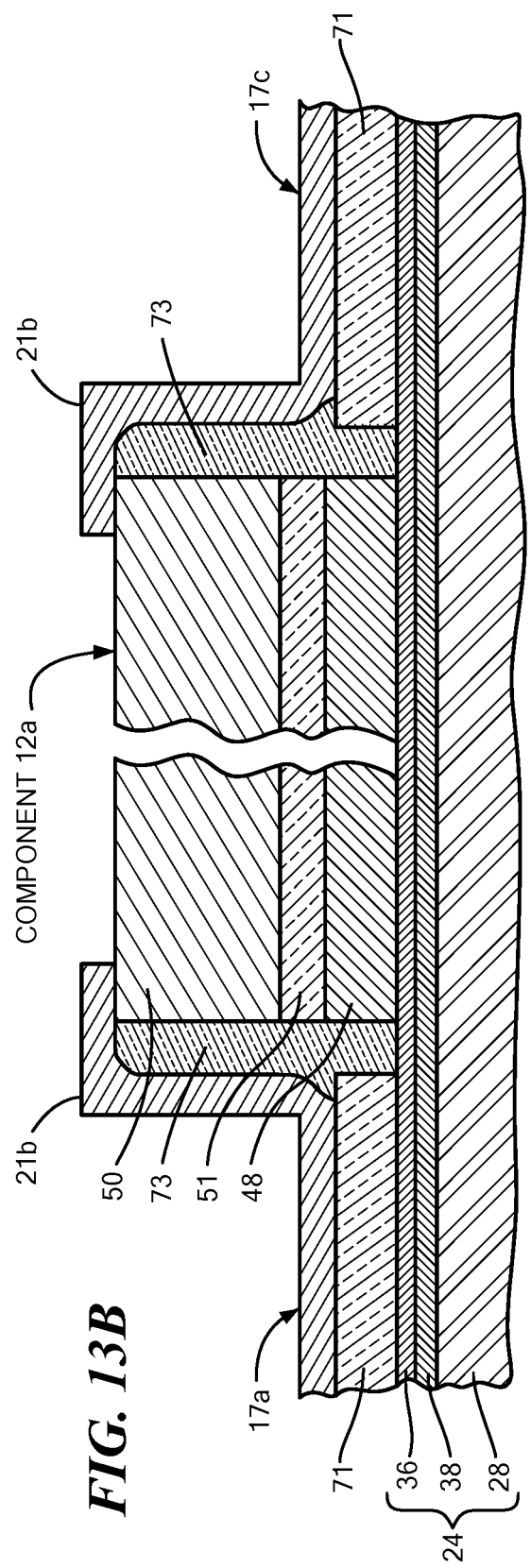

CIRCUIT SUPPORT AND COOLING STRUCTURE

TECHNICAL FIELD

This disclosure relates generally to circuit support and cooling structures.

BACKGROUND

As is known in the art, one technique used to cool electrical circuits, such as Monolithic Microwave Integrated Circuits (MMICs) include a substrate, such as Gallium Arsenide, Gallium Nitride, Silicon, or Silicon Carbide, having active, heat generating device, such as transistors, formed in a semiconductor region of the upper surface of the substrate, and passive devices, such as transmission lines, resistors, inductors, and capacitors formed on the upper surface of the substrate. The bottom surface of the MMIC substrate is bonded, and thermally coupled to a highly thermally conductive structure, such as a package base/cold plate, as shown in FIGS. 1A-1C, where the MMIC (die) is attached to the top, flat surface of the thermally conductive structure that is typically slightly larger than the MMIC. In some cases, the MIMIC is affixed (bonded) to a thermally conductive structure having a base/cold plate directly using a Thermal Interface Material (TIM), such as solder, as shown in FIG. 1A.

As is also known in the art Pyrolytic Graphite Sheets (PGS) graphite has been used as a thermally conductive structure, as shown FIG. 1C. Here, the PGS graphite is disposed between a heat sink, or cold plate, and a heat source; both the heat sink and heat source being thermally coupled to the PGS graphite. The PGS graphite has anisotropic heat conducting properties for conducing heat therethrough in the basal planes of the PGS graphite. Here, the basal planes are disposed in planes parallel to the planar, upper surface of the heat source to which the PGS graphite is attached; that is, the basal planes of the PGS graphite are parallel to the upper surface of the heat source and the bottom surface of the heat sink; thus, the preferred directions of the heat flow though the PGS graphite is an anisotropic heat conducting properties for conducing heat therethrough along directions parallel to the upper surface of the heat source and the bottom surface of the heat sink. See also U.S. Pat. No. 7,303,005 issued Dec. 4, 2017 inventors Reis et al. See also U.S. patent Application Publication No. U.S. 2003/0116312 A1, publication date Jun. 26, 2003.

As is also known in the art, ultra-high conductivity thermally conductive structures such as diamond are often used; however these thermally conductive structures are costly and the low thermal expansion of diamond can create undesirable mechanical strain on the interface materials and/or require lower thermally-performing, stress absorbing materials to handle the thermal expansion mismatch from diamond to the typically higher expansion ceramics such as Si or SiC on the device side; and metals such as copper or aluminum for the thermally conductive base.

As is also known in the art, in many applications it is desirable to also minimize the amount of surface area used to mount MMiCs. For example, in some applications, MMICs are mounted on surfaces of stacked printed circuit boards and the printed circuit boards are electrically interconnected by vertical conducive vias passing vertically through the boards. In some applications, thermally conductive vias are used to remove heat from power generating components of the MMIC and pass such heat to a cold plate mounted to the bottom of the bottom one of the stacked printed circuit board while the MMICs and devices are arranged laterally thereby using valuable printed circuit board surface area.

As is also known in the art, three-dimensional molded interconnect devices have been reported in a paper entitled: PHOTONICS APPLIED MICROELECTRONICS PROCESSING: Laser direct structuring creates low-cost D integrated circuits by Doug Gries Oct. 10, 2010. Laser Focus World, Pennwell Corporation. See also "Three dimensional transmission lines and power divider circuits" by Ali Darwish; Amin Ezzeddine published Design & Technology of Integrated Systems in Nanoscal Era, 2009, DTIS '09. 4th International Conference on 6-9 Apr. 2009 and IEEE Xplore: 15 May 2009.

SUMMARY

In accordance with the present disclosure, a structure is provided, comprising: a three-dimensional, thermally conductive support structure comprising a plurality of surfaces; and, a circuit, comprising a plurality of heat generating electrical components disposed on a first portion of plurality of surfaces of the thermally conductive support structure and interconnected by microwave transmission lines disposed on a second portion of the plurality of surfaces of the thermally conductive support structure.

With such arrangement, surface area of the circuit in reduced by using a three-dimensional, thermally conductive support structure to remove heat generated by heat generating electrical components of the circuit.

In one embodiment, the thermally conductive material has anisotropic heat conducting properties for conducting heat therethrough along a preferred plane, the preferred plane intersecting the first portion of the plurality of surfaces of the, thermally conductive support structure.

In one embodiment, the thermally anisotropic material has a conductive material disposed on the plurality of surfaces.

In one embodiment, the conductive material provides a ground plane conductor for the microwave transmission lines.

In one embodiment, the heat generating electrical components have bottom surfaces thermally coupled and bonded to the conductive material.

In one embodiment, a heat sink is thermally coupled to one of the plurality of surfaces.

In one embodiment, a structure is provided, comprising: a substrate having an input microwaves transmission line and an output microwave transmission line; a three-dimensional, thermally conductive support structure comprising a plurality of surfaces; and, a circuit, comprising a plurality of heat generating electrical components disposed on different ones of the plurality of surfaces of the thermally conductive support structure and interconnected by microwave transmission lines disposed on different ones of the plurality of surfaces of the thermally conductive support structure; and wherein the circuit is electrically connected to the input microwaves transmission line and an output microwave transmission line.

In one embodiment, a cooling structure is provided, comprising: a heat spreader comprising thermally anisotropic material, such material having anisotropic heat conducting properties for conducting heat therethrough along a preferred plane; and, a circuit, comprising a plurality of heat generating electrical components disposed on different ones of a first portion of the plurality of surfaces of the heat spreader and interconnected by microwave transmission lines disposed on different ones of the plurality of surfaces of the heat spreader.

In one embodiment, the plurality of surfaces having the heat generating electrical components intersect the preferred plane of the thermally anisotropic material.

In one embodiment, the thermally anisotropic material has a conductive material disposed on the plurality of surfaces.

In one embodiment, the conductive material provides a ground plane conductor for the microwave transmission lines.

In one embodiment, the heat generating electrical components have bottom surface thermally coupled and bonded to the conductive material.

In one embodiment, the cooling si e includes a heat sink thermally coupled to one of the plurality of surfaces.

In one embodiment, a cooling structure is provided, comprising: a substrate having: a plurality of microwave transmission lines disposed on an upper surface of the substrate; and an opening passing through the substrate. A cold plate having a cavity formed in an upper surface of the cold plate is thermally coupled to a bottom surface of the substrate. A heat spreader is provided comprising thermally anisotropic material, such material having anisotropic heat conducting properties for conducting heat therethrough along a preferred plane is provided. The heat spreader has a lower portion passing through the opening onto a bottom surface of the cavity, A circuit is disposed on an upper portion of the heat spreader, the circuit comprising a plurality of heat generating electrical components disposed on different ones of a first portion of a plurality of surfaces of the heat spreader and interconnected by microwave transmission lines disposed on a second portion of the plurality of surfaces of the heat spreader, the preferred plane intersecting the first portion of a plurality of surfaces of the heat spreader.

In one embodiment, a substrate is provided having an input microwaves transmission line and an output microwave transmission line and wherein the circuit is electrically connected to the input microwaves transmission line and an output microwave transmission line.

The details of one or more embodiments of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 2A-2D are simplified, diagrammatical, perspective sketches of a cooling structure according to the disclosure;

FIG. 2A' is an enlarged portion of the cooling structure shown in FIG. 2A, such portion being enclosed by the arrow labelled 2A'-2A' in FIG. 2A, according to the disclosure;

FIG. 8 through FIG. 12D are diagrammatical sketches useful in understand the process used to form the cooling structure of FIGS. 2A-2D;

FIGS. 13A and 13B are diagrammatical, cross-sectional sketches of a portion of the cooling structure of FIGS. 2A-2D showing the process used to electrically interconnect a microwave transmission line of the heat spreader of FIG. 4 with an exemplary one of an electrical component, partially broken, attached to a side of the heat spreader at various steps in such process according to the disclosure;

Like reference symbols in the various drawings indicate like elements.

DETAILED DESCRIPTION

Figure 1A:
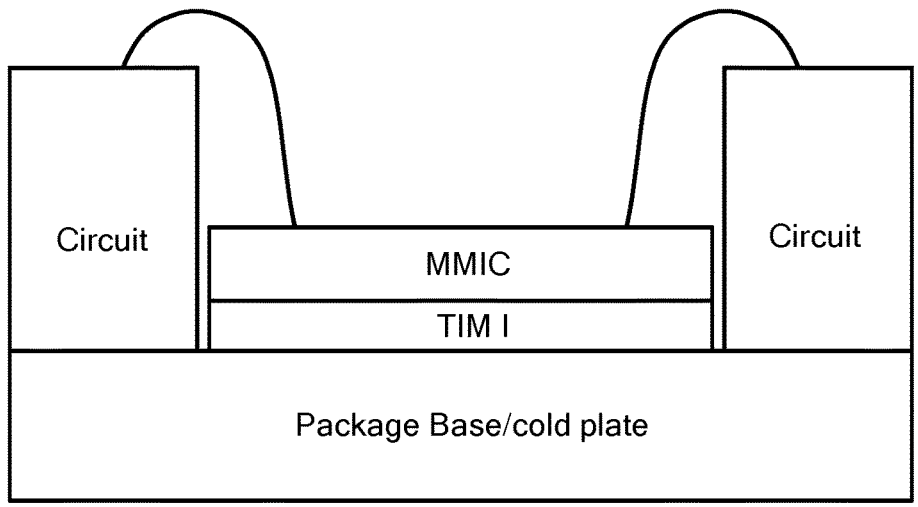
FIGS. 1A-1C are cross sectional diagrammatical sketches of Monolithic Integrated Circuit (MMIC) cooling structures according to the PRIOR ART.
Figure 1B:
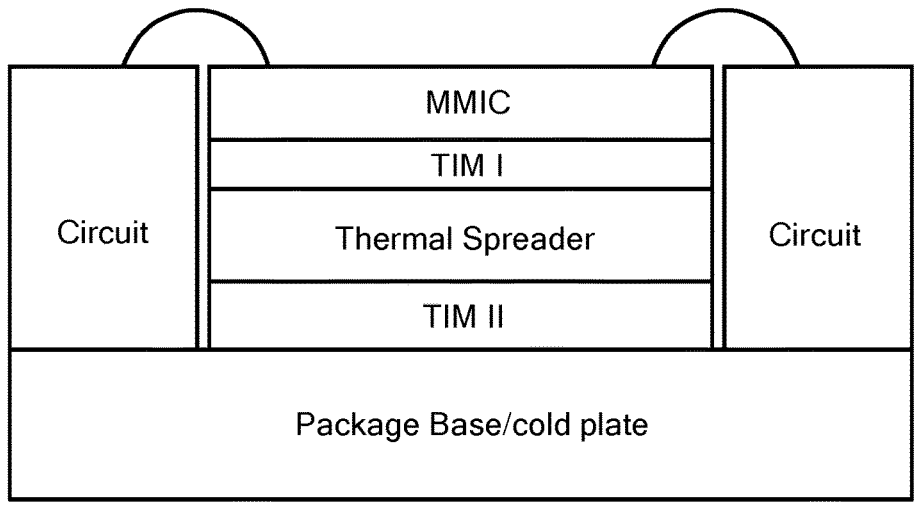
Figure 1C:
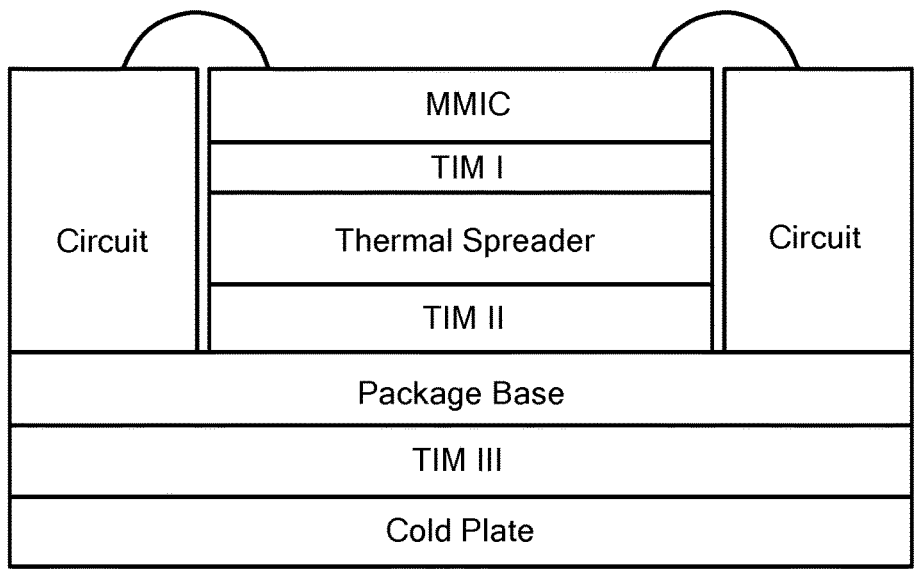
Figure 1D:
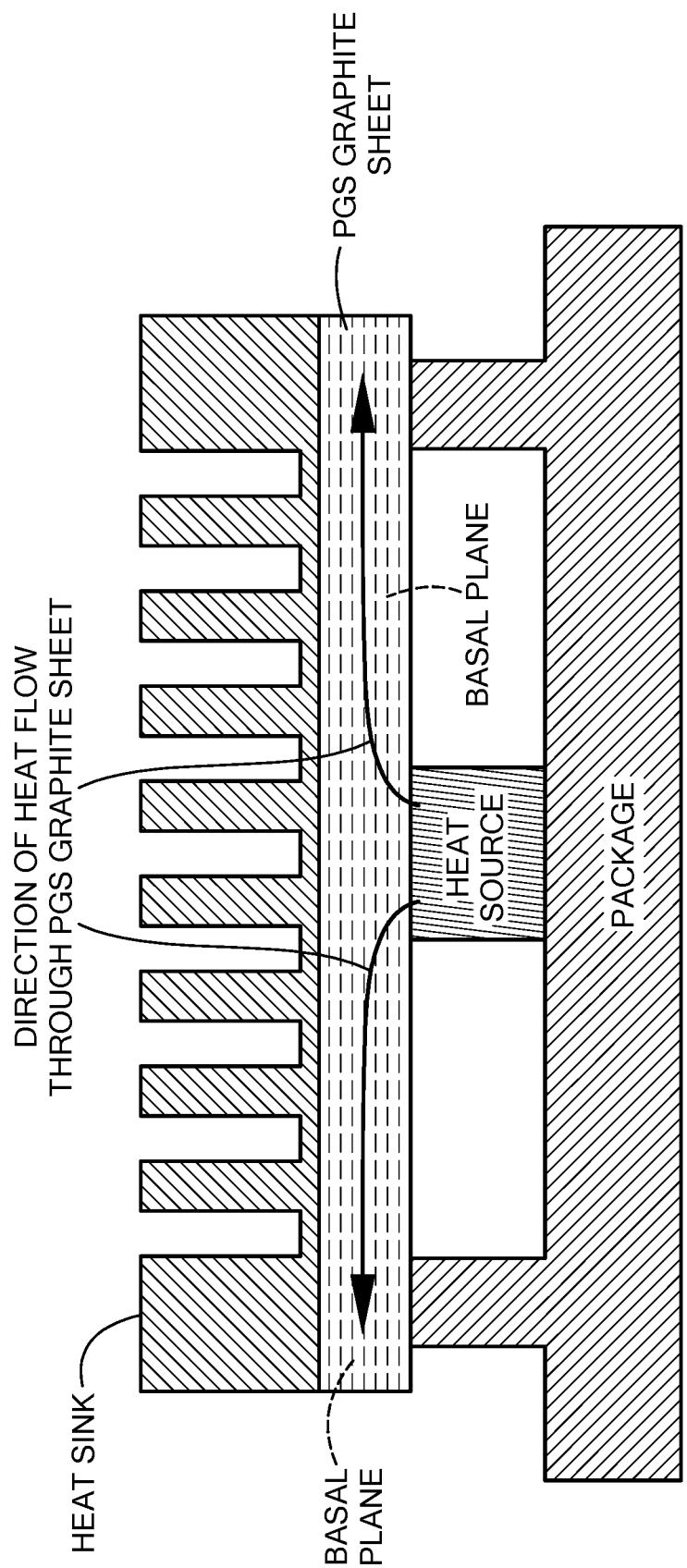
FIG. 1D is a cross sectional diagrammatical sketch of a cooling system using a Pyrolytic Graphite Sheets (PGS) graphite heat spreader according to the PRIOR ART.
Figure 2B:
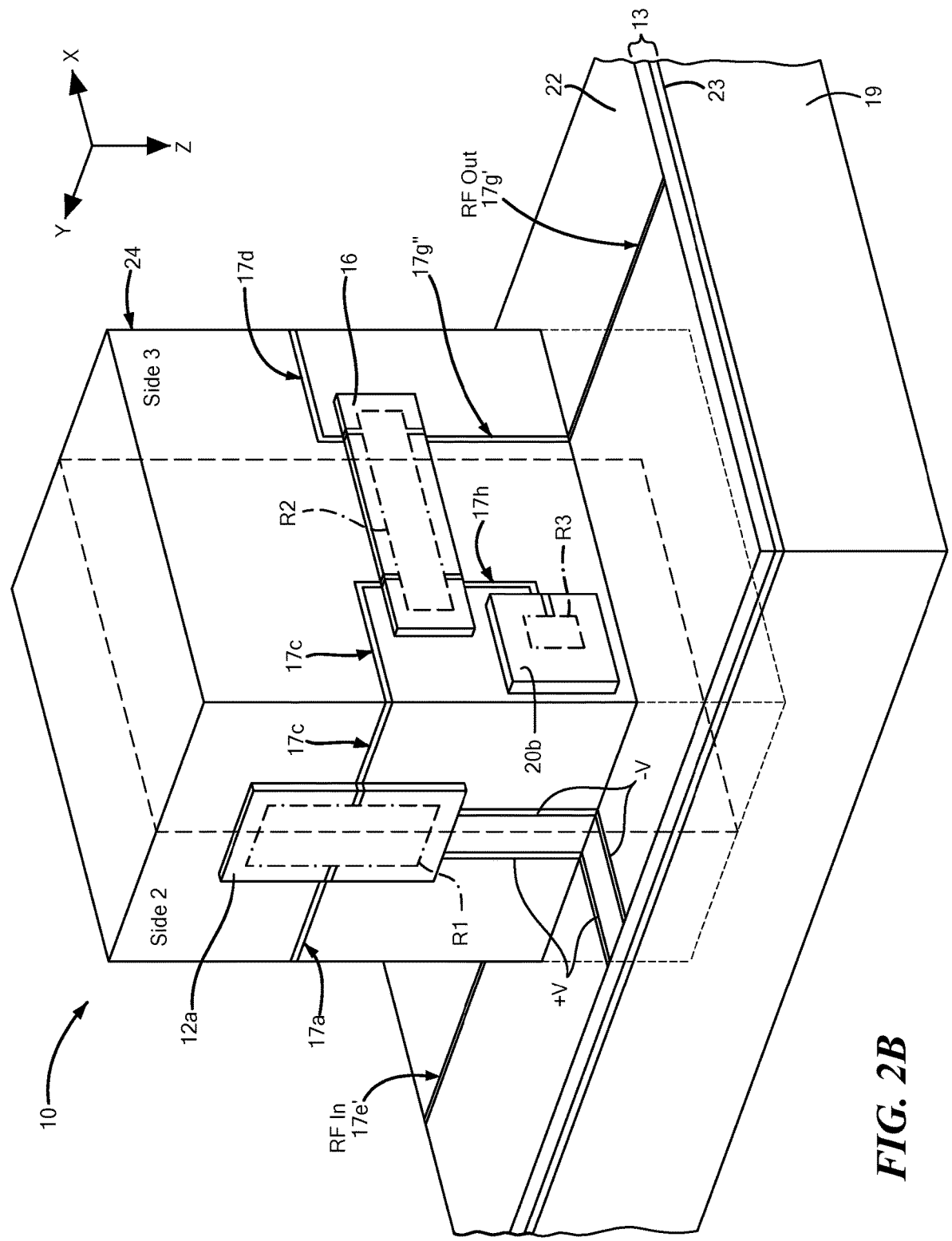
Figure 2C:
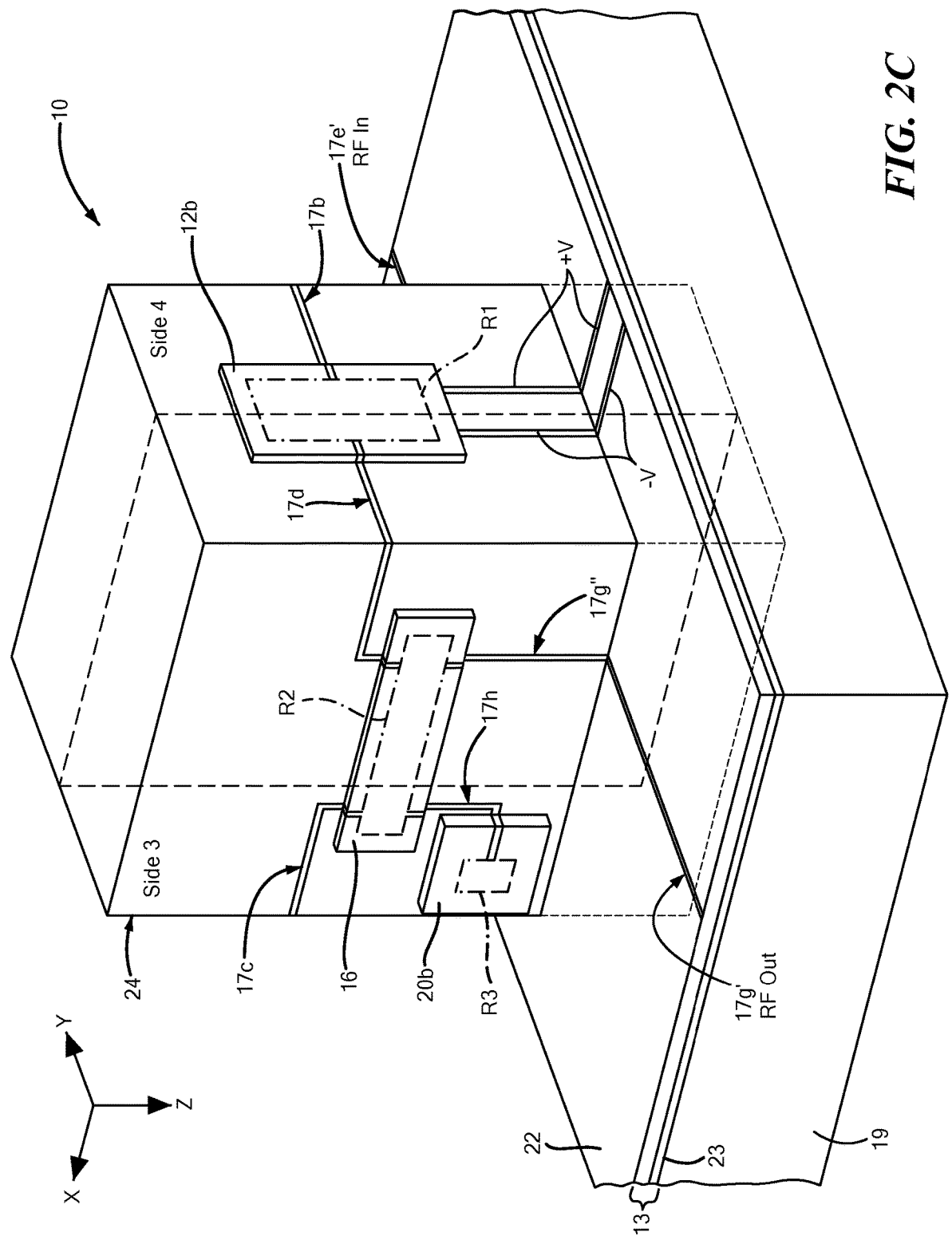
Figure 2D:
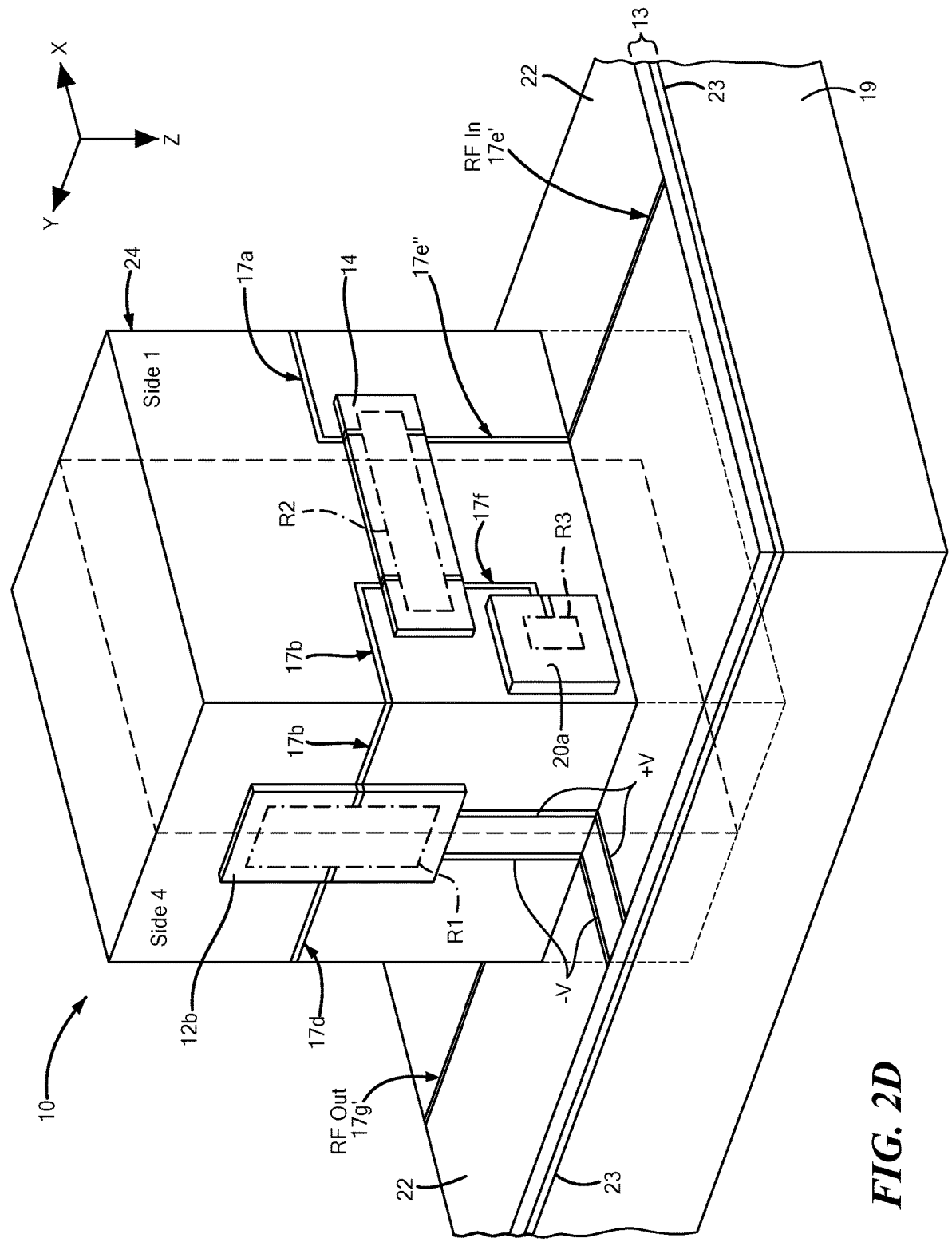
Figure 3A:
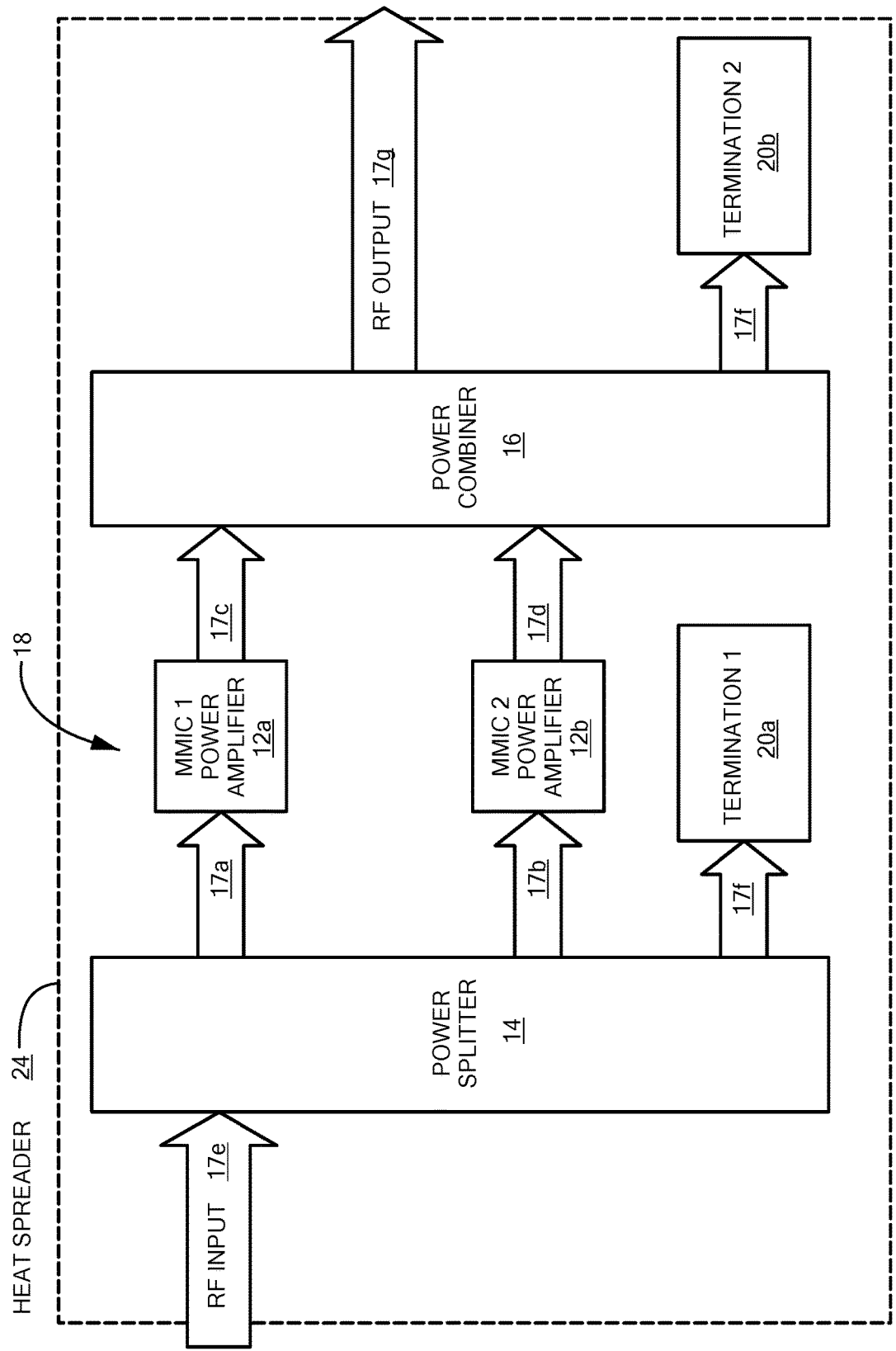
FIG. 3A is a schematic block diagram of a circuit formed on a thermal heat spreader of the cooling structure of FIGS. 2A-2D according to the disclosure.
Figure 3B:
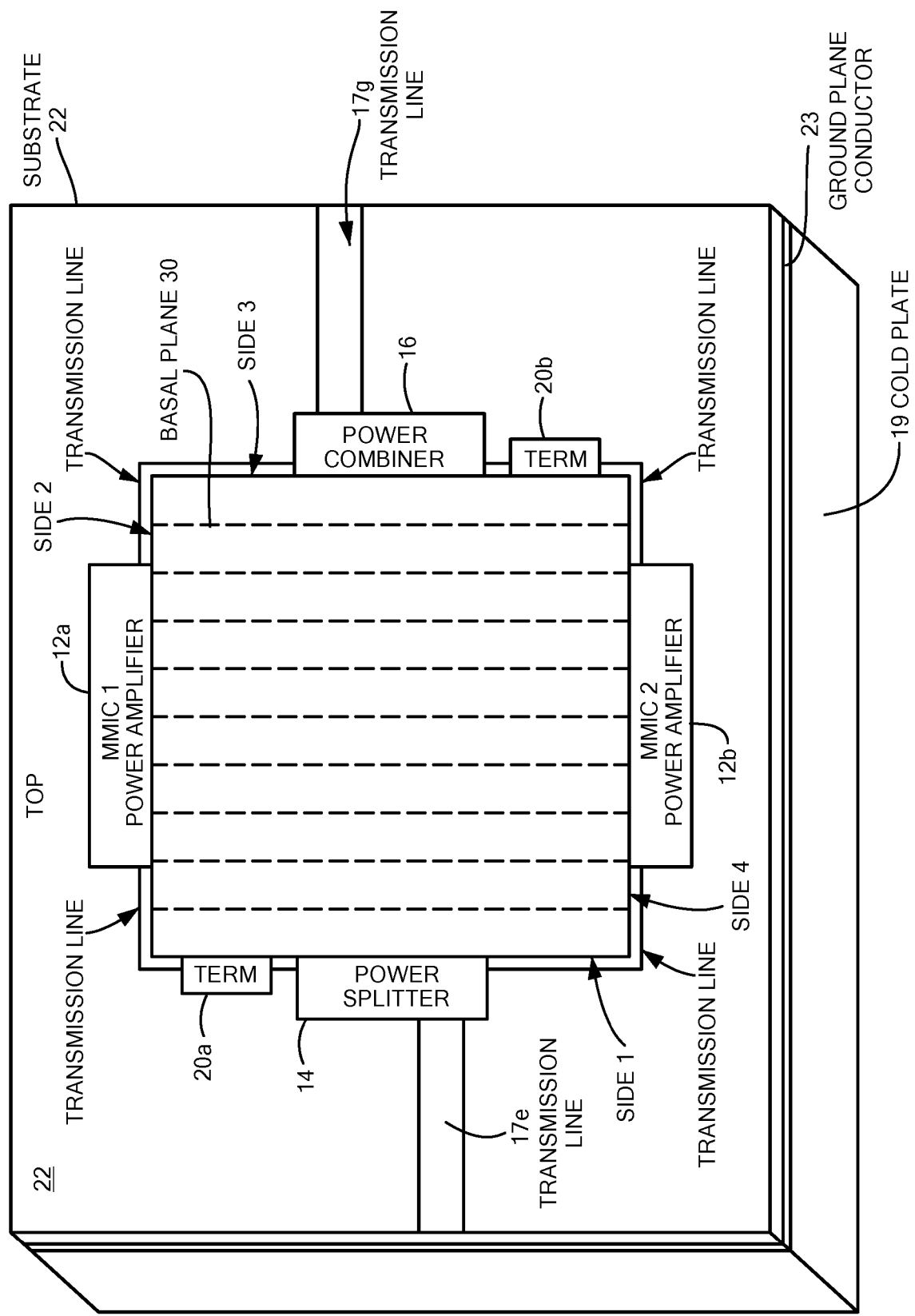
FIG. 3B is a simplified, diagrammatical sketch the cooling structure of FIGS. 2A-2D according to the disclosure.

Referring now to FIGS. 2A-2D, 3A and 3B and FIG. 5, a cooling structure 10 for cooling active, heat generating electrical components, here for example, a pair of Field Effect Transistor (FET) MMIC power amplifiers 12*a*, 12*b* connected between passive circuits, or electrical components, here for example, a power splitter 14 and a power combiner 16, by microwave transmission lines 17*a*, 17*b*, respectively, and microwave transmission lines 17*c*, 17*d*, respectively, as shown, to form a portion of the electrical circuit 18, as shown in FIG. 3. The MMIC power amplifiers 12*a*, 12*b*, power splitter 14, power combiner 16 and microwave transmission lines 17*a*, 17*b*, 17*c* and 17*d* are disposed on a heat spreader 24, to be described and shown in more detail in FIG. 4. It is to be noted here, however, that the pair of MMIC power amplifiers 12*a*, 12*b* are thermally coupled to a heatsink/cold plate 19 of the cooling structure 10 through a thermally coupled heat spreader 24 to be described in more detail in connection with FIG. 4.

Figure 5:
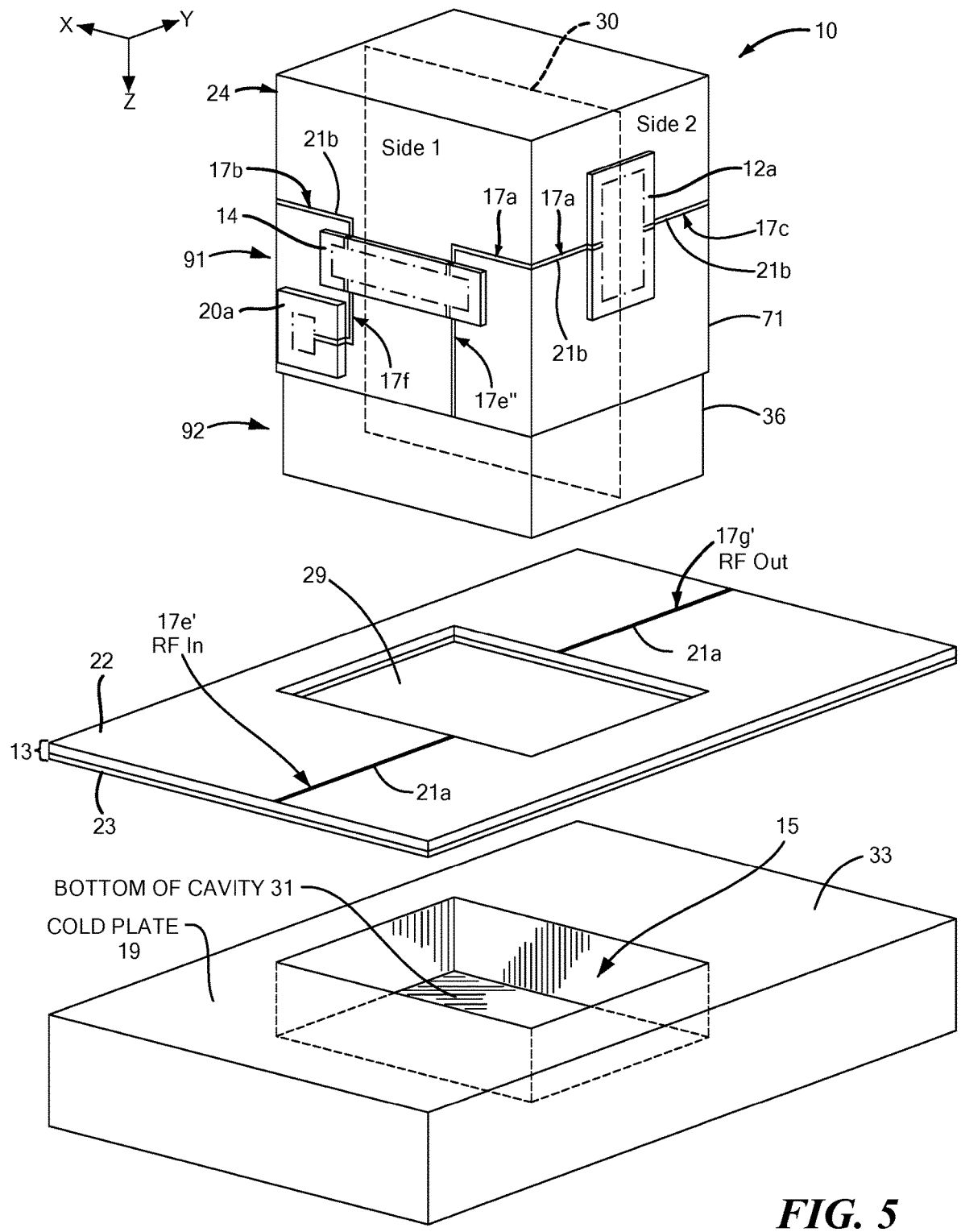
FIG. 5 is an exploded, diagrammatical perspective view sketch, of the cooling structure of FIGS. 2A-2D according to the disclosure.

More particularly, referring again to FIGS. 2A and 2B, the power splitter 14 is a conventional four-port power splitter, disposed on. SIDE 1 of the heat spreader 24, for having: one port fed by an RF input signal on transmission line 17*e*, a second port connected to conventional matched impedance terminator 20*a*, disposed on SIDE 1 of the heat spreader 24, through microwave transmission line 17*f*; and a pair of output ports, each one being coupled to a corresponding one of a pair of the pair of MMIC power amplifiers 12*a*, 12*b*, disposed on opposites SIDE 2 and SIDE 4, respectively, of the heat spreader 24, through the pair of microwave transmission lines 17*a*, 17*b*, respectively, as shown. The outputs of each one of the MMIC power amplifiers 12a, 12b is coupled as inputs to the conventional four-port power combiner 16, disposed on SIDE 3 of the heat spreader 24, here a conventional four-port power combiner 16 (here also disposed on the heat spreader 24), having a pair of output ports through the microwave transmission lines 17c, 17d, respectively, as shown; one of the pair of output ports providing an RF output signal on microwave transmission line 17g and the other being connected to a conventional matched terminator 20b, disposed on SIDE 3 of the heat spreader 24, through microwave transmission line 17h, as shown. Here the microwave transmission lines 17a-17h are microstrip transmission lines. Referring now to FIG. 5, it is noted that a bottom portion of the heat spreader 24 passes through an opening 29 in a printed circuit board 13 having: a dielectric substrate 22 and a ground plane conductor 23 on a bottom surface of the substrate 22. The printed circuit board 13 has formed on the upper surface thereof: a transmission line 17e' which is connected to a microwave transmission line 17e" formed on side 1 of the heat spreader 24, the transmission line 17e' and connected transmission line 17e" forming the input transmission line 17e, and a transmission line 17g' which connects to a microwave transmission line 17g" formed on side 3 of the heat spreader 24, the transmission line 17g' and connected transmission line 17g" forming the input transmission line 17g.

As shown more clearly in FIG. 5, the bottom portion of the heat spreader 24 passes through the opening 29 in the printed circuit board 13 onto a bottom surface 31 of a cavity 15 formed an portion of an upper surface 33 of a cold plate 19. A suitable thermal interface material (TIM) such as solder or thermally conductive adhesive 53 (FIGS. 2A, 2A') is used to bond the upper surface 33 of the cold plate to the ground plane conductor 23 and the bottom surface of the heat spreader 24 and lower portions of the sidewalls to the heat spreader 24 to the sidewalls and bottom surface of the of the cavity 15, as shown in FIG. 2A' The microstrip transmission lines 17e and 17g', here microstrip transmission lines, are formed on the printed circuit board 13 by strip conductors 21a disposed on portions of the upper surface of the dielectric substrate 22 and a ground plane conductor 23 disposed on the bottom surface of the dielectric substrate 22.

Figure 4:
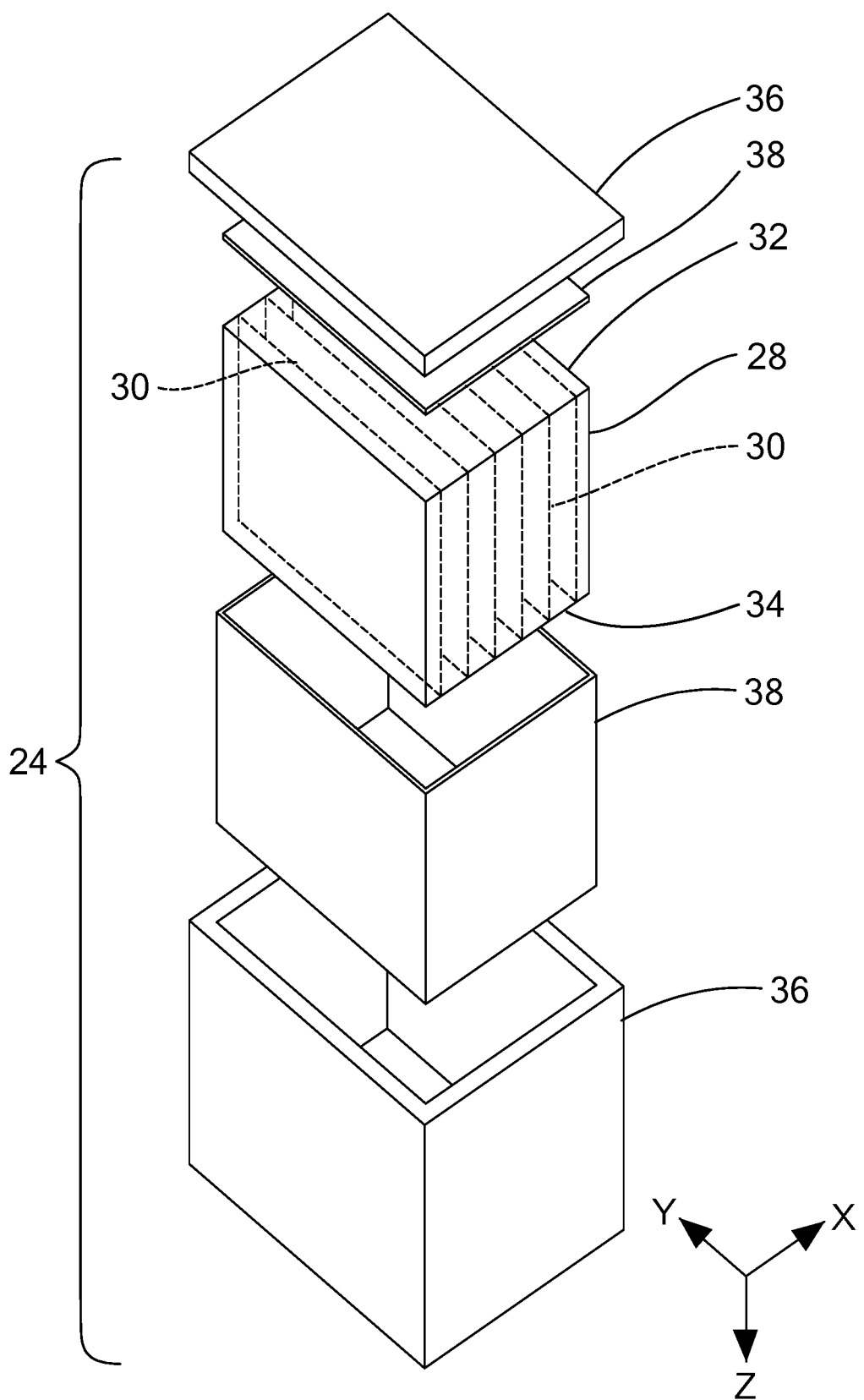
FIG. 4 is an exploded, perspective diagrammatical sketch of the thermal heat spreader of FIGS. 3A and 3B, with portions of one of the e elements thereof being partially broken away to show a portion of a bottom surface of such element of the thermal heat spreader of the cooling structure of FIGS. 2A-2D according to the disclosure.

The heat spreader 24, here in this example, is a three-dimensional, thermally conductive support structure, multi-sided, here in this example, a six-sided structure, and is shown in more detail in FIG. 4 having a six-sided thermally anisotropic material 28, here for example pyrolytic graphite, having basal planes, indicated by dashed lines 30 disposed, in this example, in the Y-Z plane, that is, in this example, perpendicular to the upper surface 32 and the bottom surface 34 of the thermally anisotropic material 28. Thus, heat spreader 24 has anisotropic heat conducting properties for conducting heat therethrough along preferred planes (the basal planes 30). Here, in this example, the four vertical sides (Side 1, Side 2, Side 3 and Side 4) of the heat spreader 24, and the thermally anisotropic material 28 are rectangular is shape, here longer along the Z-axis than along either the X-axis or Y-axis. It should be understood that other shapes may be used, for example, they may have more or less than four sides, further, the bottom portion of the heat spreader 24, and the thermally anisotropic material 28 may be tapered. Further, as will be described in more detail below, the basal planes 30 intersect the bottom surface having the ground plane 51 of the heat generating MMIC power amplifiers 12a, 12b, here at ninety degree angles. It should be noted that while, in this example, the upper, or top, and lower, or bottom, surfaces 32, 34 of the thermally anisotropic material 28, are in the X-Y plane, the basal planes 30 may be in the X-Z plane, or one portion of the basal planes may be in the Y-Z plane and another portion may be in the X-Z plane.

The heat spreader 24 includes a thermally and electrically conductive material 36, here for example a metal, such as copper, serves as an encasing material, sometimes referred to herein as an encapsulation material 36, to encase all six outer surfaces (top, bottom and four sides) of the thermally anisotropic material 28. More particularly, the six outer surface of the thermally anisotropic material 28 are brazed to the thermally conductive material 36 with a suitable brazing material 38, here for example, CuSil an alloy of 72% silver and 28% copper (±1%) marketed by Morgan. Advanced Materials, Quadrant 55-57 High Street Windsor Berkshire, United Kingdom, SL4 1LP; a eutectic alloy primarily used for vacuum brazing. In another method of attachment, no external bonding agent is used between thermally anisotropic material 28 and thermally conductive material 36; for example using; heat and pressure, such as thereto-compression bonding or hot isostatic pressing, for example, Thus, the thermally conductive material 36 is an encapsulating material used to encapsulate the thermally anisotropic material 28 and is sometimes also referred to herein as encapsulation material 36.

Figure 6A:
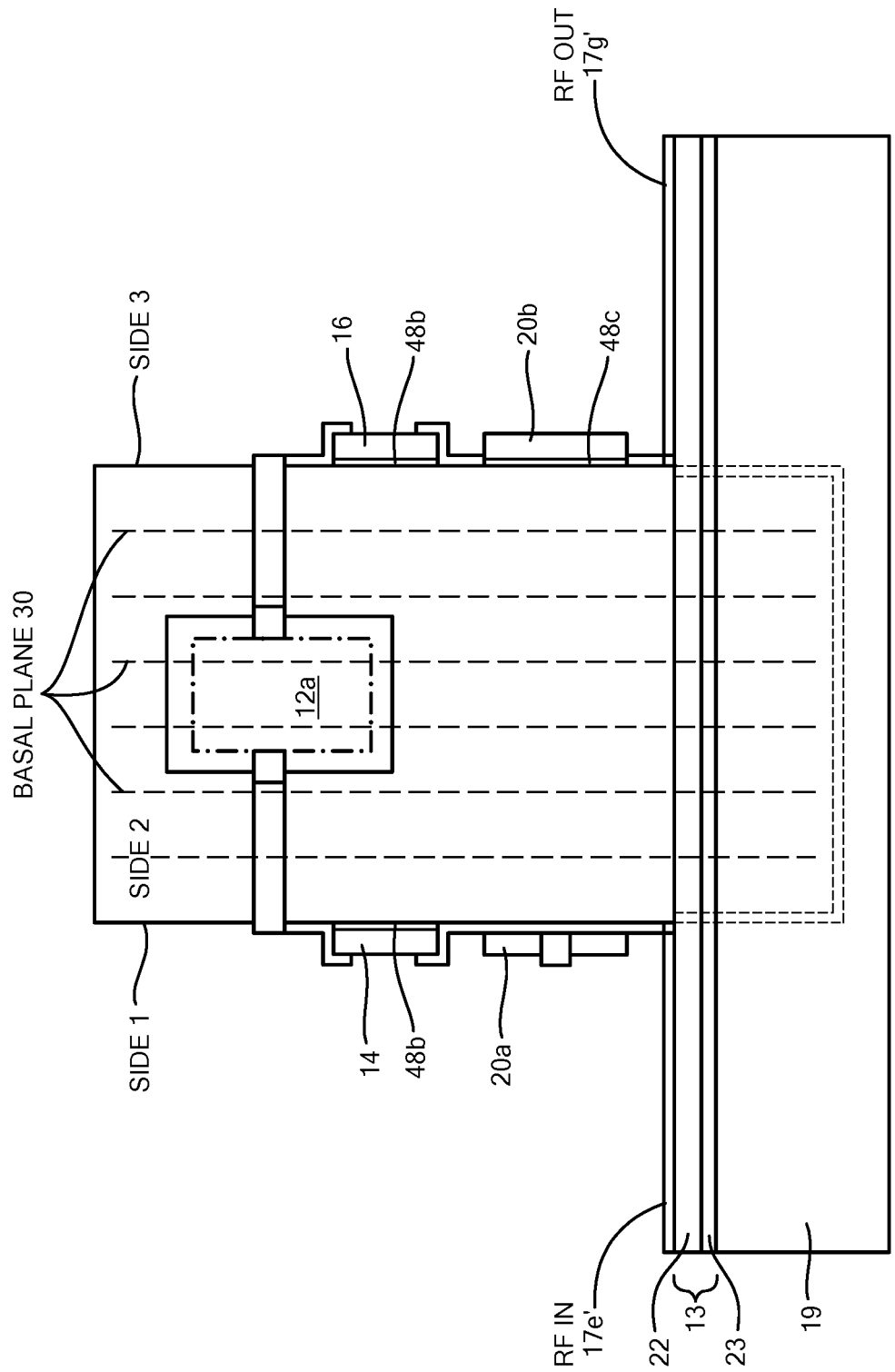
FIGS. 6A-6D are simplified, side elevation views of the cooling structure of FIGS. 2A-2D according to the disclosure showing heat flow through the cooling structure of FIGS. 2A-2D according to the disclosure.
Figure 6B:
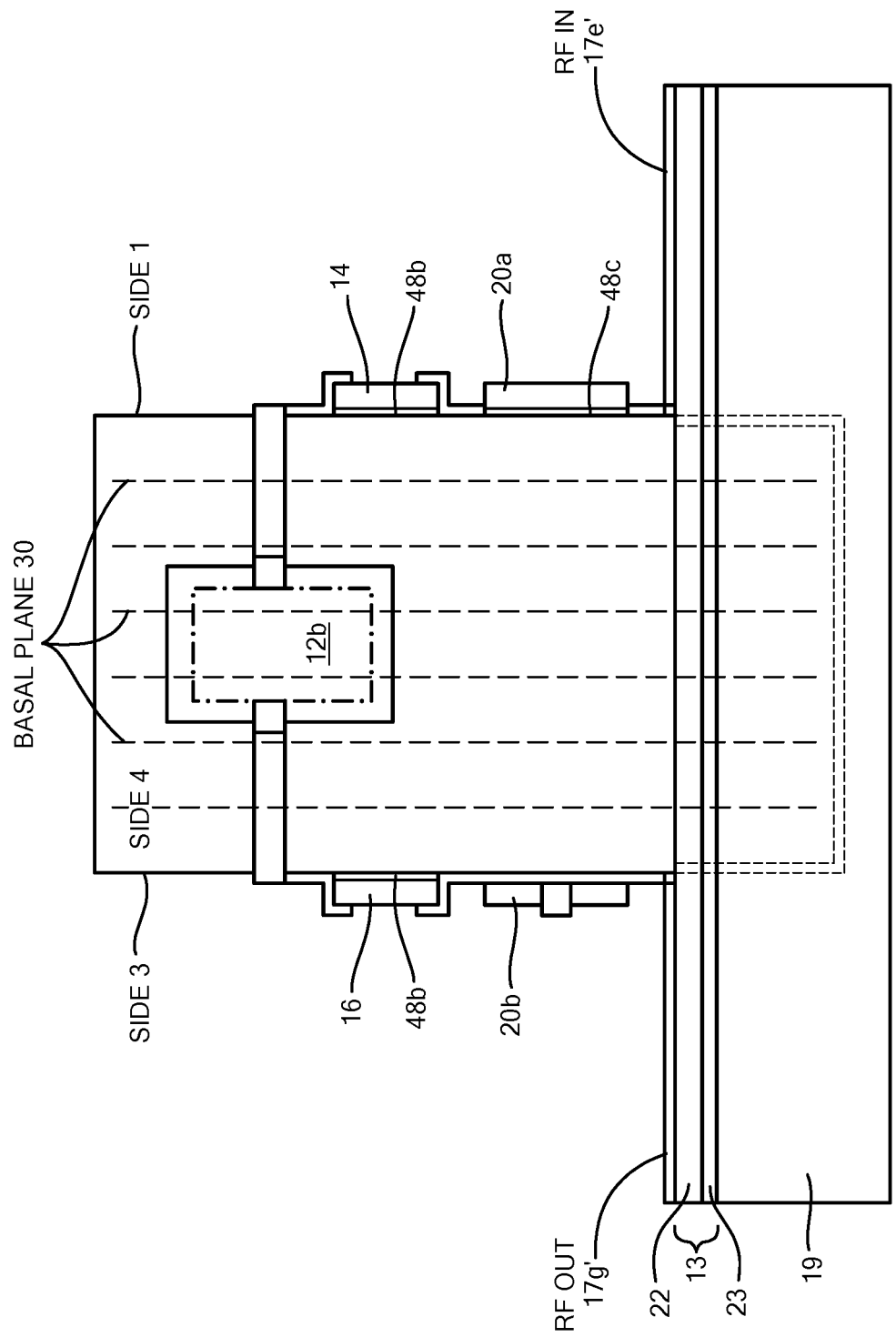
Figure 6C:
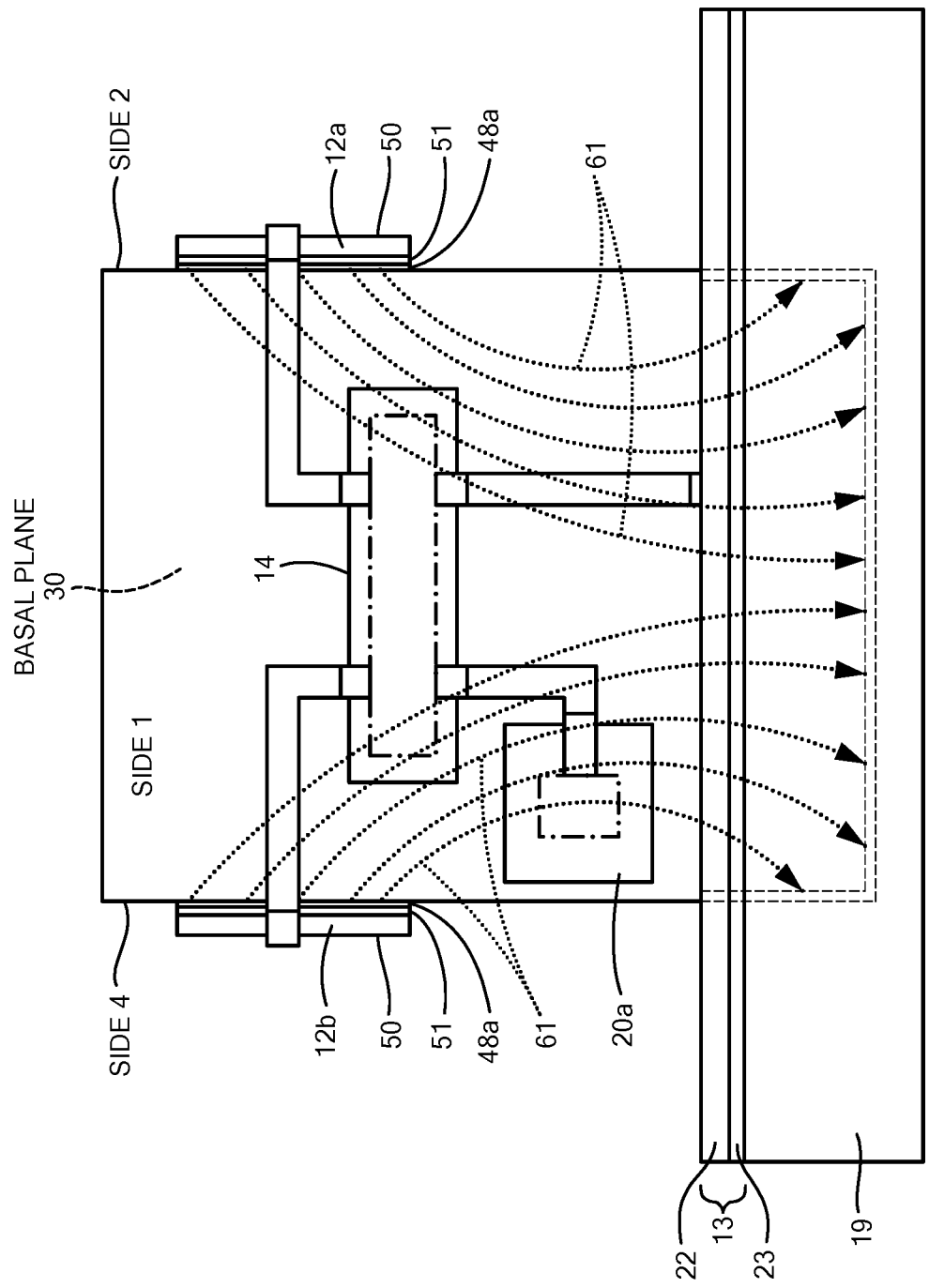
Figure 6D:
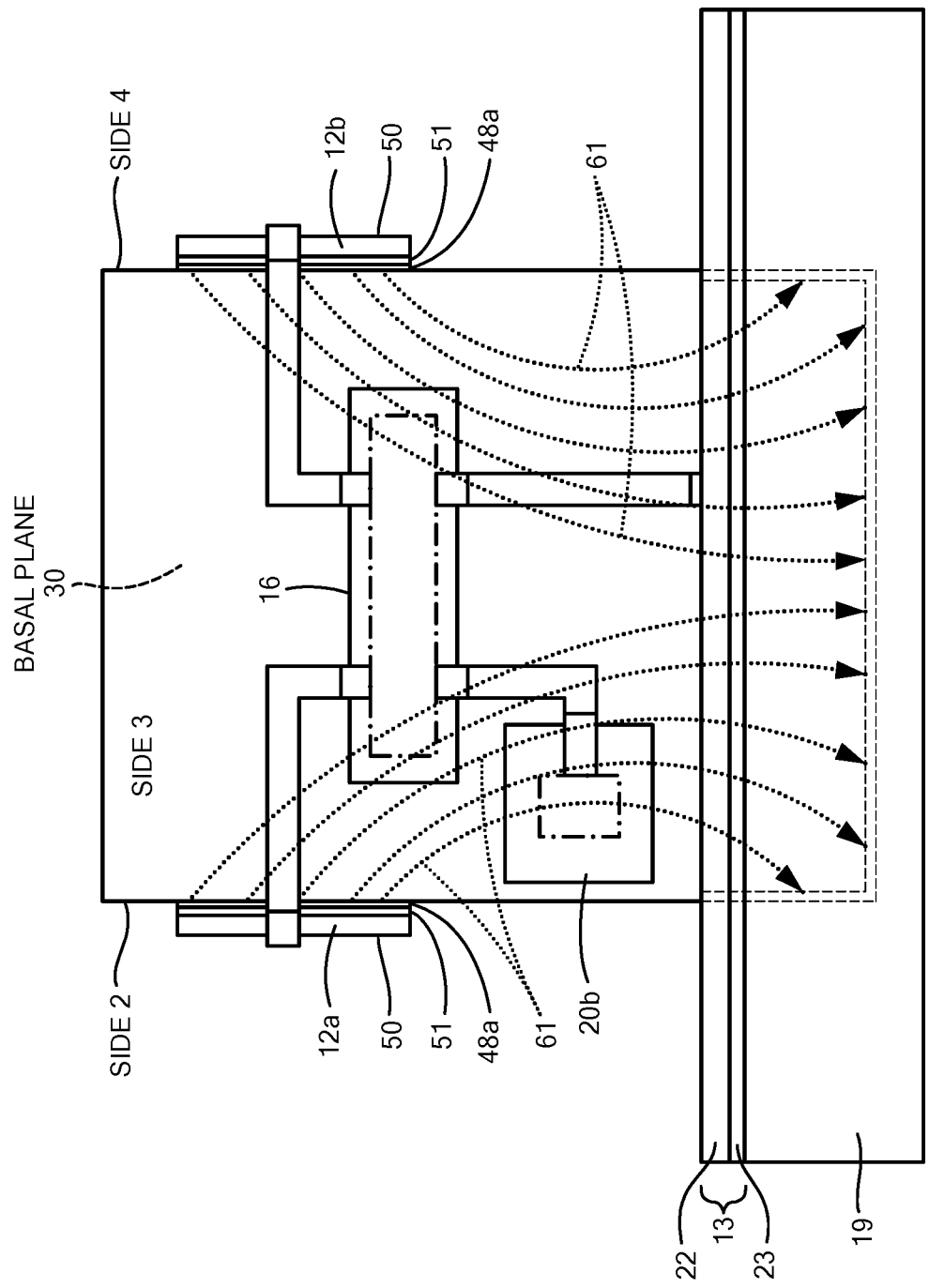

In addition, all six outer surfaces do not have to be made out of the same encapsulation material 36. In one example, the surface of the encapsulation material 36 in contact with the MIMIC power amplifiers 12a, 12b can be made out of a high-thermal conductivity, but low CTE metal, such as Tungsten (4 PPM/° C.), Molybdenum (5.5 PPM/° C.), an alloy of Copper-Tungsten (5-10 PPM/° C.), an alloy of Copper-Molybdneum (6-10 PPM/° C.), or other such materials. In another example, this surface of material 36 in contact with the MMIC power amplifiers 12a, 12b can be made out of a ceramic, for example, Aluminum-Nitride (4.5 PPM/° C.), or Silicon Nitride (3.5 PPM/° C.), or others, which also have high thermal conductivity and a lower GTE. In doing so, an attachment surface, that is, the surface of encapsulation material 36 in contact with the MMIC power amplifiers 12a, 12b has a lower GTE, as compared to metal like Copper (18 PPM/° C.). Since the MMIC power amplifiers 12a, 12b, here have a substrate 50 (FIGS. 6C, 6D) made of, for example, Silicon Carbide, which has a lower CTE (2.8 PPM/° C.), the use of a high thermal conductivity with low CTE material on the top surface of encapsulation material 36 provides good thermal transport with improved CTE matching between the substrate 50 of the MMIC power amplifier 12a, 12b and the underlying heat spreader structure 24. A higher degree of CTE matching between the substrate 50 of the MMIC power amplifier 12a, 12b and the underlying heat spreader structure 24, thus achieved, reduces thermal-induced stresses in the substrate 50 of the MMIC power amplifier 12a, 12b when the cooling structure 10 is exposed to temperature excursions during operation. Thus, improved GTE matching improves the mechanical reliability of the cooling structure 10 by lowering them tab-induced stresses. Better degree of GTE matching thus achieved, also helps increase the choice of materials available to be used for the Thermal interface Materials (TIM) (e.g. solder), here layer 48a, (FIGS. 6C and 6D) and to be described in more detail in connection with FIGS. 9A through 12D used to attach a ground plane 51 (FIGS. 6C and 6D) on the bottom of the substrate 50 of the MMIC power amplifier 12a, 12b to the heat spreader 24 because TIM layer 43a stresses are lowered. This further improves thermal transfer from the substrate 50 of the MMIC power amplifier 12a, 12b into cold plate/heat sink 19 through TIM layer 48 and heat spreader 24. For example, if the CTE mismatch between the substrate 50 of the MMIC power amplifier 12a, 12b and the top surface of the heat spreader 24, more particularly the encapsulating material 36, was higher, only a certain category of materials could be used for TIM layer 48a because, being disposed between the substrate 50 of the MMIC power amplifier 12a, 12b and the surfaces of the encapsulation material 36 of heat spreader 24, thermally coupled to the MMIC power amplifier 12a, 12b they would now be subjected to higher thermal-induced stresses. With better CTE matching between substrate 50 of the MMIC power amplifier 12a, 12b and the heat spreader 24, a larger number of thermally higher performing TIM materials become available as options. In this example, the encapsulation layer material 36, can be of Copper (18 PPM/° C.) and can be perfectly CTE-matched to the heat sink/cold plate 19 also made of copper. Thus, improved CTE matching is achieved on all sides of the spreader 24 by employing a combination of encapsulation materials rather than one single material. It is also possible to employ different materials for all or some of the remaining sides, as dictated by the CTE matching and thermal transfer needs of a given application. Thus all or any of the six encapsulating sides can be made out of a metal or a non-metal, as noted above. If non-metal then the added step of writing the ground plane precedes writing the dielectric. The power splitter 14 and power combiner 16 are also bonded to the heat spreader 24 using a TIM e layer 48b (FIGS. 6A and 6B). Likewise the terminators 20a, 20b are also bonded to the heat spreader 24 using a TIM layer 48c (FIGS. 6A and 6B). As noted above, here the microwave transmission lines 17a-17g arc here microstrip transmission lines with portions of such lines being bonded to the heat spreader. It is noted that to provide CTE matching the TIM layer 48a, 48b and 48c may be different bonding material CTEs. It is noted that the basal planes 30 are parallel to sides 2 and 4 and perpendicular to sides 1 and 3 and hence perpendicular to the bottom surfaces of the power amplifiers 12a and 12b. The heat low from the power amplifiers 12a, 12b to the heat sink/cold plate 19 is shown by the arrows 61 in FIGS. 6A-6D. It is noted that a device region R1 (reference FIG. 2) is disposed on the upper surface of substrate 50, such region R having therein active devices, here, for example, FETs, passive devices, such as, for example, resistors, capacitors and inductors, and interconnecting microwave transmission lines arranged in any conventional manner to form the pair of the Field Effect Transistor (FET) MMIC power amplifiers 12a, 12b. It is also noted that the power splitter 14 and power combiner 16 components have passive device regions R2 (reference FIG. 2) having for example, microwave transmission lines arranged to form such power splitter 14 and power combiner 16 in any conventional manner. Likewise, the terminators 20a, 20b have passive devices, such as resistors, arranged in any conventional manner to provide proper impedance machining termination components.

As described above, the bottom portion of the heat spreader 24 passes through an opening 29 in the printed circuit board 13 onto the bottom surface of a cavity 15 formed a portion of an upper surface of a cold plate 19. Thus, as shown in FIG. 2A', a small gap 60 is left between the ends of the microwave transmission lines 17e', 17g' on the printed circuit board 13 and the bottom portion of the heat spreader 24. This gap 60 is filled by injection into the upper portion of the gap 60 with an elastic dielectric material 63, such as a silicone material, as shown. Next bridging strip conductor 64 is printed onto the dielectric material 63 to electrically interconnect the strip conductor 21a on the printed circuit board 13 of the microwave transmission lines 17e', 17g' of the dielectric substrate 22 to the strip conductor 21b (FIG. 5) of the microwave transmission lines 17e'', 17g'' on the heat spreader 24 and thereby form transmission line 17e, 17g as described above.

It is noted that the conductive encapsulation material 36 is electrically and thermally connected to the heat sink 197 and therefore to the ground plane conductor 23 of the printed circuit board 13. Thus, other passive elements in addition to directional couplers and power divider/combiners, such as resistors, capacitors, and inductors, for example, may be formed on the sides of the heat spreader 24 using dielectric material and conductive material arranged appropriately to form such passive devices. For example, a resistive material may then be printed over the dielectric material printed and cured on the conductive encapsulation material 36 in a region where a resistor is to be formed with one end of the resistive material being connected to a strip conductor of a microwave transmission line and the other end being connected to a printed strip, conductor that passes over the edge of the dielectric material to the conductive encapsulation material 36, which as noted above, is electrically connected to the ground plane conductor 23. For example, the terminators 20a, 20b may be such a resistor having an impedance to provide a matched load for the electrical circuit 18 (FIGS. 3A, 3B).

Figure 7A:
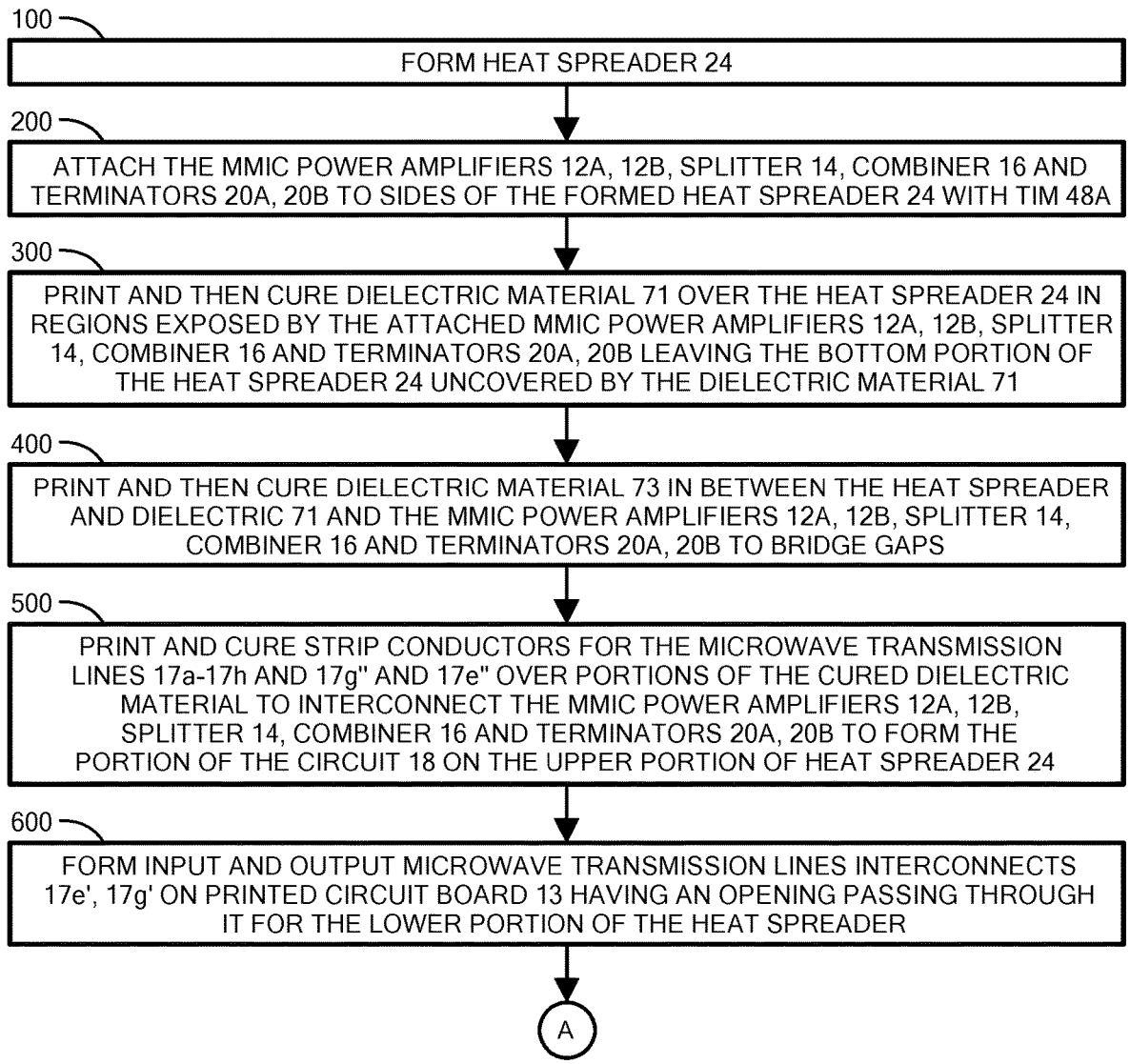
FIGS. 7A and 7B together is a flow diagrams of the process used to form the cooling structure of FIGS. 2A-2D according to the disclosure.
Figure 7B:
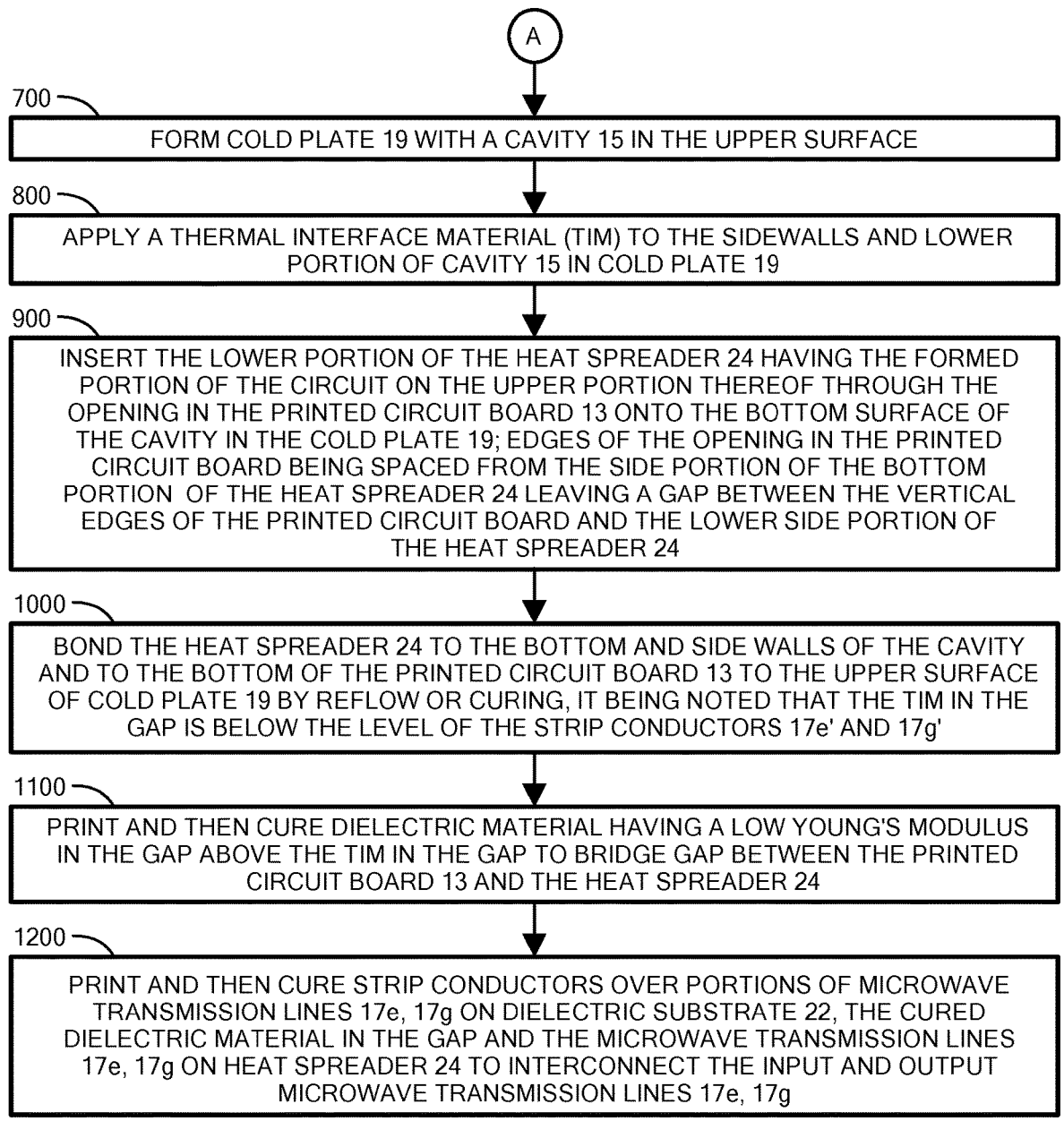
Figure 8:
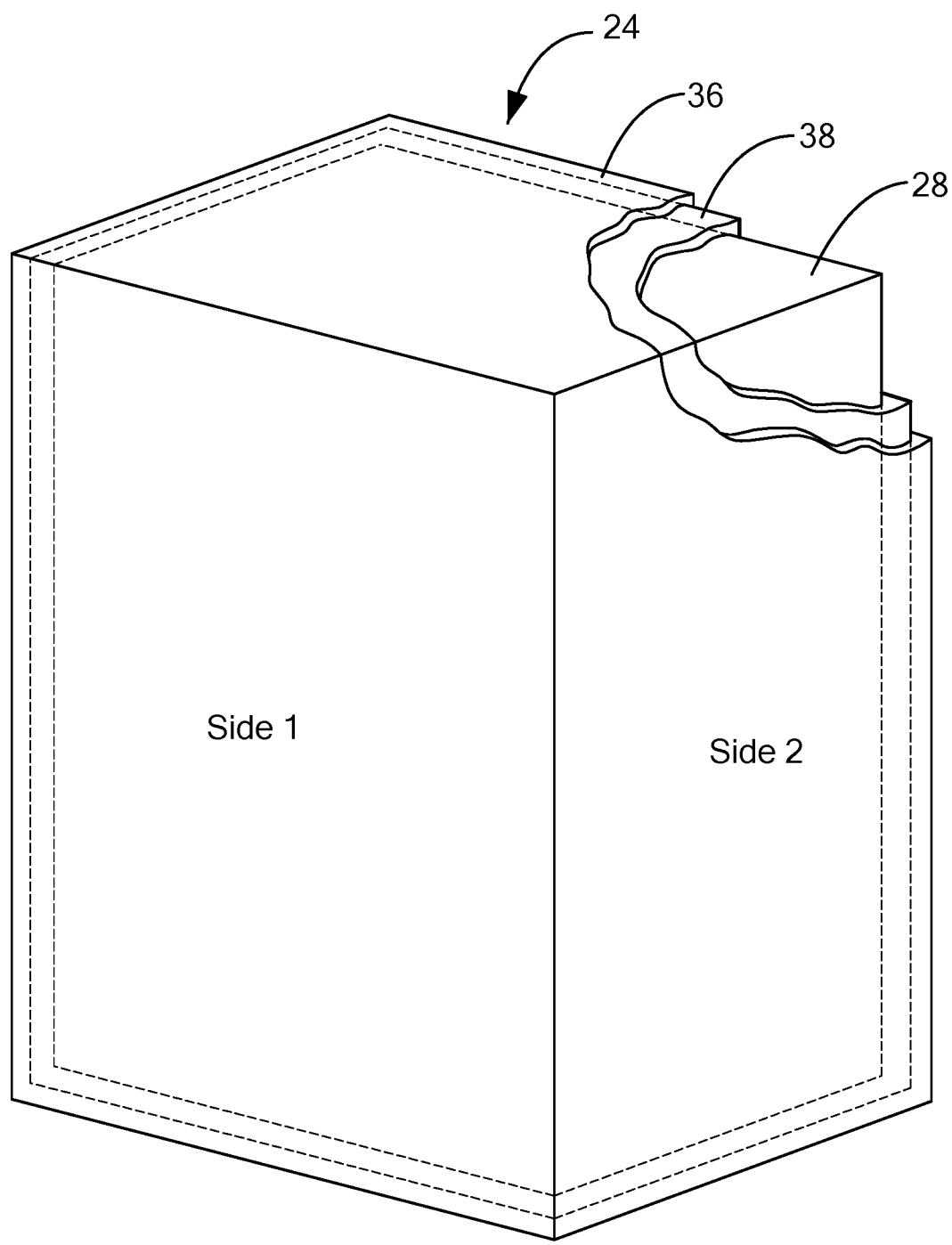
Figures 10A, 10B:
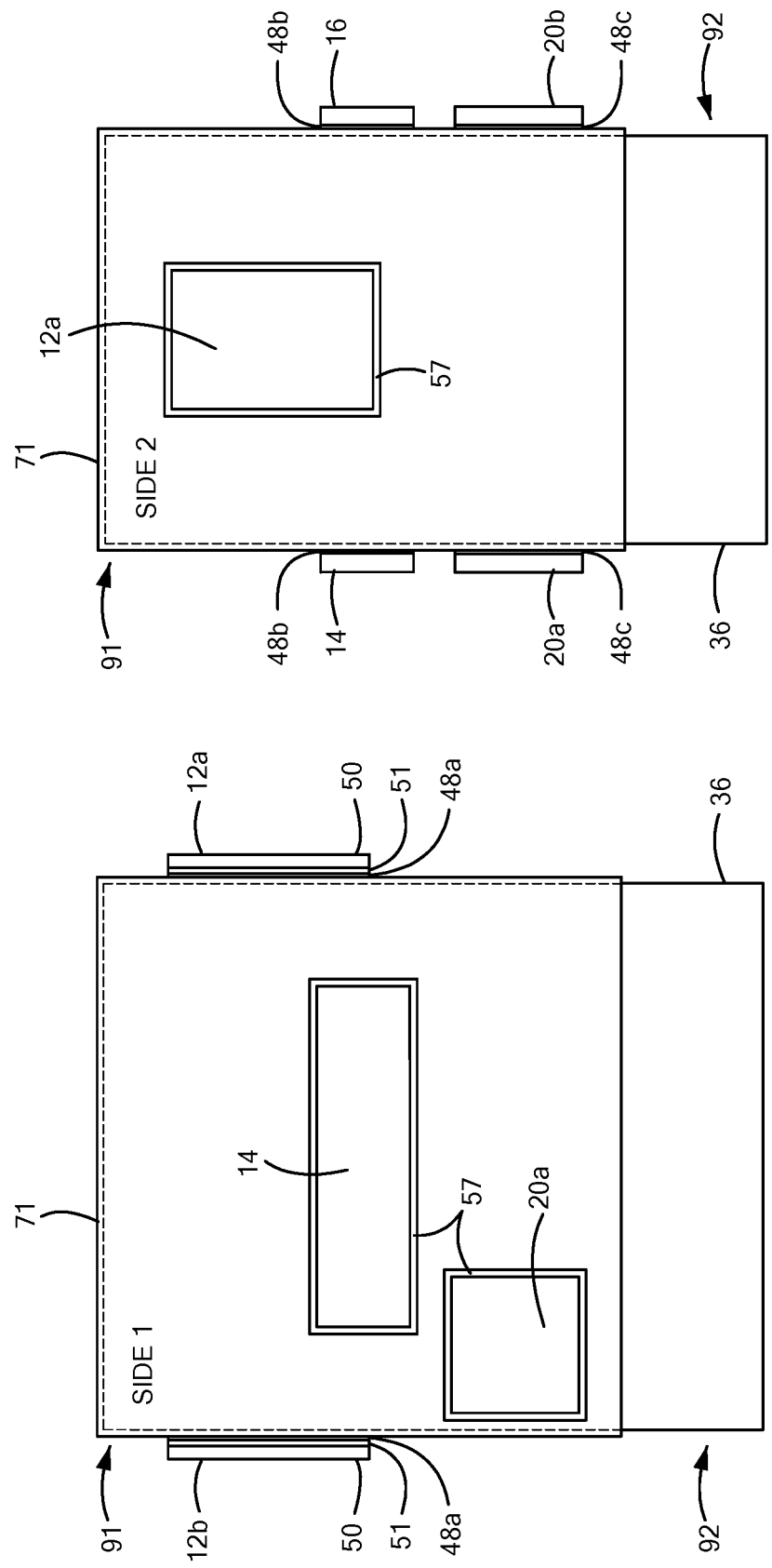
Figures 12C, 12D:
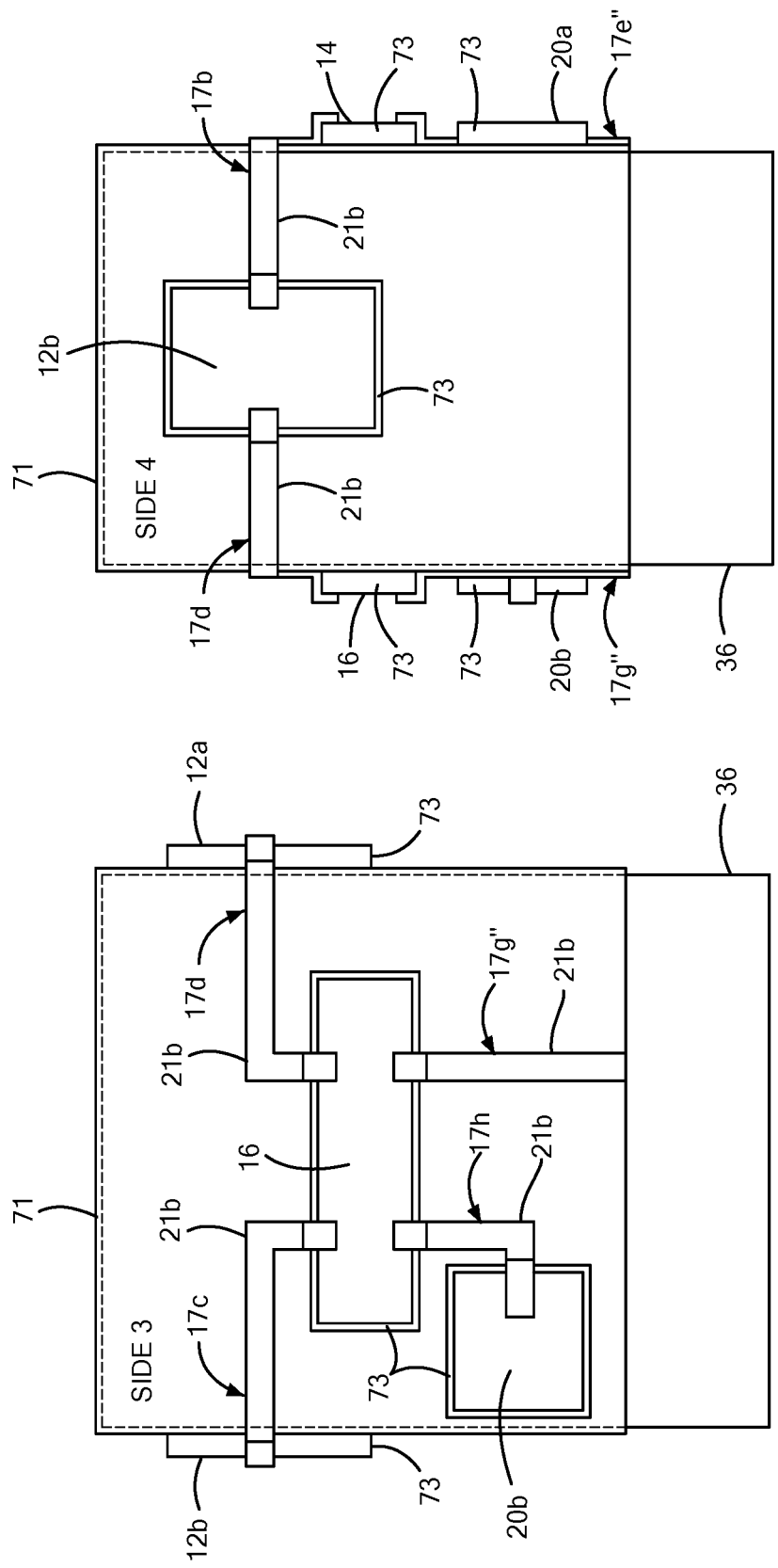

Referring now to FIG. 7, a flow diagram of the process used to form the cooling structure 10, FIGS. 2A-2D is shown. It is first noted that the process may be performed using computer controlled Additive Manufacturing (AM) or 3D printed processes. The heat spreader 24 is formed (FIG. 8), Step 100. The MMIC power amplifiers 12a, 12b, splitter 14 and combiner 16 are attached to sides of the formed heat spreader 24 with TIM 48a with the ground plane conductors 51 as described above in connection with FIGS. 6C and 6D (FIGS. 9A-9D) Step 200. It is again noted that the ground plane conductors 51 of the MMIC power amplifiers 12a, 12b are perpendicular to the basal planes 30 while the ground plane conductors 51 of the splitter 14 and combiner 16 are parallel to the basal planes 30, see FIGS. 6A-6D, A dielectric material 71 is printed and then cured over the heat spreader 24 in regions exposed by the attached MMIC power amplifiers 12a, 12b, splitter 14, combiner 16 and terminators 20a, 20b and also leaving the lower and bottom portions of the heat spreader 24 uncovered thereby leaving the encapsulating material 36 exposed on the lower and bottom portions of the heat spreader 24 (FIGS. 10A-10D), Step 300. A dielectric material 73 is printed and then cure to till any seam, or small space 57 (FIG. 13A), that may exist between the cured dielectric material 71 and the components: the MMIC power amplifiers 12a, 12b; splitter 14; and combiner 16, and terminators 20a, 20b, as shown in FIGS. 13A and 13 B for an exemplary one of the components, here for example, the MMIC power amplifier 12a, (FIGS. 11A-11D). Step 400. Strip conductors 21b (FIGS. 5, 12A-12D) are printed and cured on the dielectric materials 71 and 73 to form the microwave transmission lines 17a-17h and 17g'' and 17h'' to interconnect the components thereby forming the portion of the circuit 18 (FIG. 3A) on the upper portion 91 (FIGS. 5, 12A-12D) of the sides 14 of heat spreader 24, Step 500. The dielectric material '73 has a low Young's modulus (an elastic dielectric material such as, for example, silicone). The Young's modulus is selected to enable expansion and contraction of such elements over the temperature operating and storage range without resulting in breakage of electrical interconnect passing over such gap filling materials.

Form the input and output microwave transmission lines interconnects 17e', 17g' are on printed circuit board 13, such printed circuit board 13 having the opening 29 passing through it for receiving the lower portion 92 (FIGS. 5, 12A-12D) of the heat spreader 24, Step 600.

The cold plate 19 is formed with the cavity 15 in the upper surface, Step 700.

A thermal interface material (TIM) 53, here for example solder, is applied to the upper surface of the cold plate 19 and to the sidewalls and bottom of cavity 15 in cold plate 19 (FIG. 2A'), Step 800. The lower portion 92 (FIGS. 5, 12A-12D) of the heat spreader 24 is inserted through the opening 29 in the printed circuit board 13 onto the bottom surface of the cavity 15 in the cold plate 19. It is noted in FIG. 2A' that vertical edges of the opening 29 in the printed circuit board 13 are spaced from the encapsulating material 36 on the sides of the lower portions 92 of the heat spreader 24 thereby leaving a gap 60 between the vertical edges of the printed circuit board 13 and the encapsulating material 36, Step 900. It is noted in FIG. 2A' that the thermal interface material (TIM) 53 is applied below the level of strip conductors of the input and output microwave transmission lines interconnects 17e', 17g' and the TIM 53 is used to bond the encapsulating material 36 to the sidewalls and bottom surface of the heat spreader 24 to the sidewalls and bottom of the cavity 15 and also bond the printed circuit board 13 (the ground plane conductor 23 (FIG. 2A') to the upper surface of the cold plate 19 by reflow or curing, Step 1000. A dielectric material 63 (FIG. 2A') having a low Young's modulus (an elastic dielectric material such as, for example, silicone) is printed and then cured in the gap 60 above the thermal interface material (TIM) 53 (FIG. 2A'), Step 1100. The Young's modulus is selected to enable expansion and contraction of such elements over the temperature operating and storage range without resulting in breakage of electrical interconnect passing over such seam or bridge gap filling materials. Bridging strip conductors 64 are printed and then cured over portions of strip conductors of the microwave transmission lines 17e', 17g' on dielectric substrate 22 and cured over portions of strip conductors of the microwave transmission lines 17e'', 17g'' on the dielectric material 71 to electrically interconnect the input and output microwave transmission lines 17e, 17g on the printed circuit board 13 with the microwave transmission lines 17e, 17g on the heat spreader 24 and thereby complete the circuit 18, Step 1200.

It should be understood that other sequences and procedures may be used to maximize yield and performance. Further, it should be understood that the Coefficients of Thermal Expansions (CTEs) of bonding material used should be selected to Match as closely as possible the CTEs of the elements being bonded and still have sufficient bonding strength over the temperature operating and storage range. Likewise, dielectric filling materials used to fill gaps and seams between elements should have sufficient elasticity (Young's modulus) to enable expansion and contraction of such elements over the temperature operating and storage range without resulting in breakage of electrical interconnect passing over such seam or bridge gap filling materials. It should be noted that the transmissions and splitter, combiner or other matching networks and accompanying bias networks may be realized on the structure 24 in a number of ways. Dielectric materials may be additively printed using paste or filament and the strip conductors on the heat spreader 24 may be printed using AM or 3D printing. Alternately, the circuit may be formed on a flexible, conformable substrate and then bonded to the structure 24 with a suitable TIM. The microwave transmission lines 17a-17h may be formed using, for example, computer controlled Additive Manufacturing (AM) or 3D printing, for example. In addition, while the example has described microwave transmission lines, bias control lines including lines +V, −V (FIGS. 2A-2D) for supplying voltages to the MMIC amplifiers 12a, 12b may also be printed on dielectric layer 71 on the same or additional layers of dielectric 71.

Figure 14:
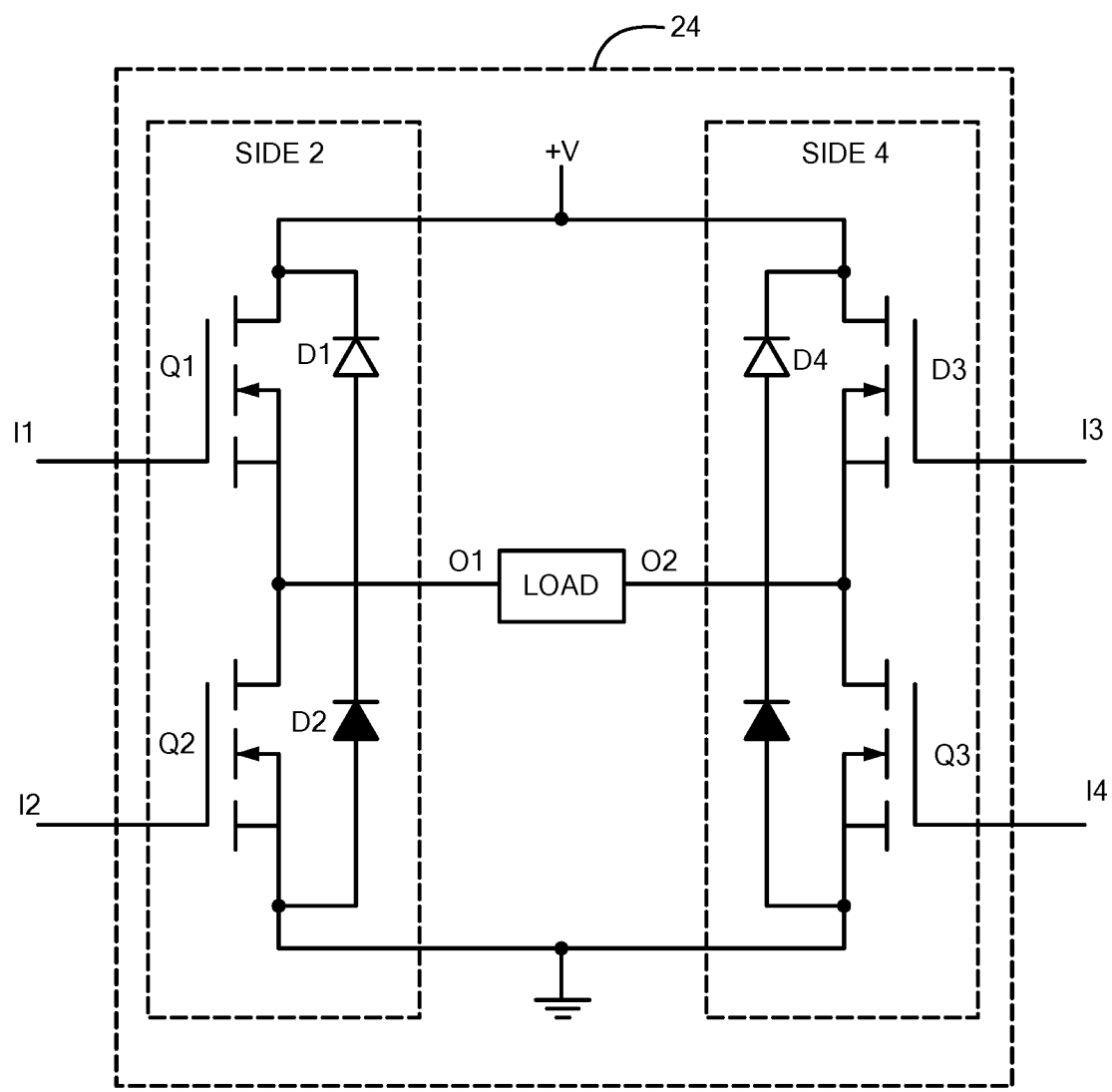
FIG. 14 is schematic block diagram of an H-bridge circuit adapted for configuration on four sides of a heat spreader according to the disclosure.
Figure 14A:
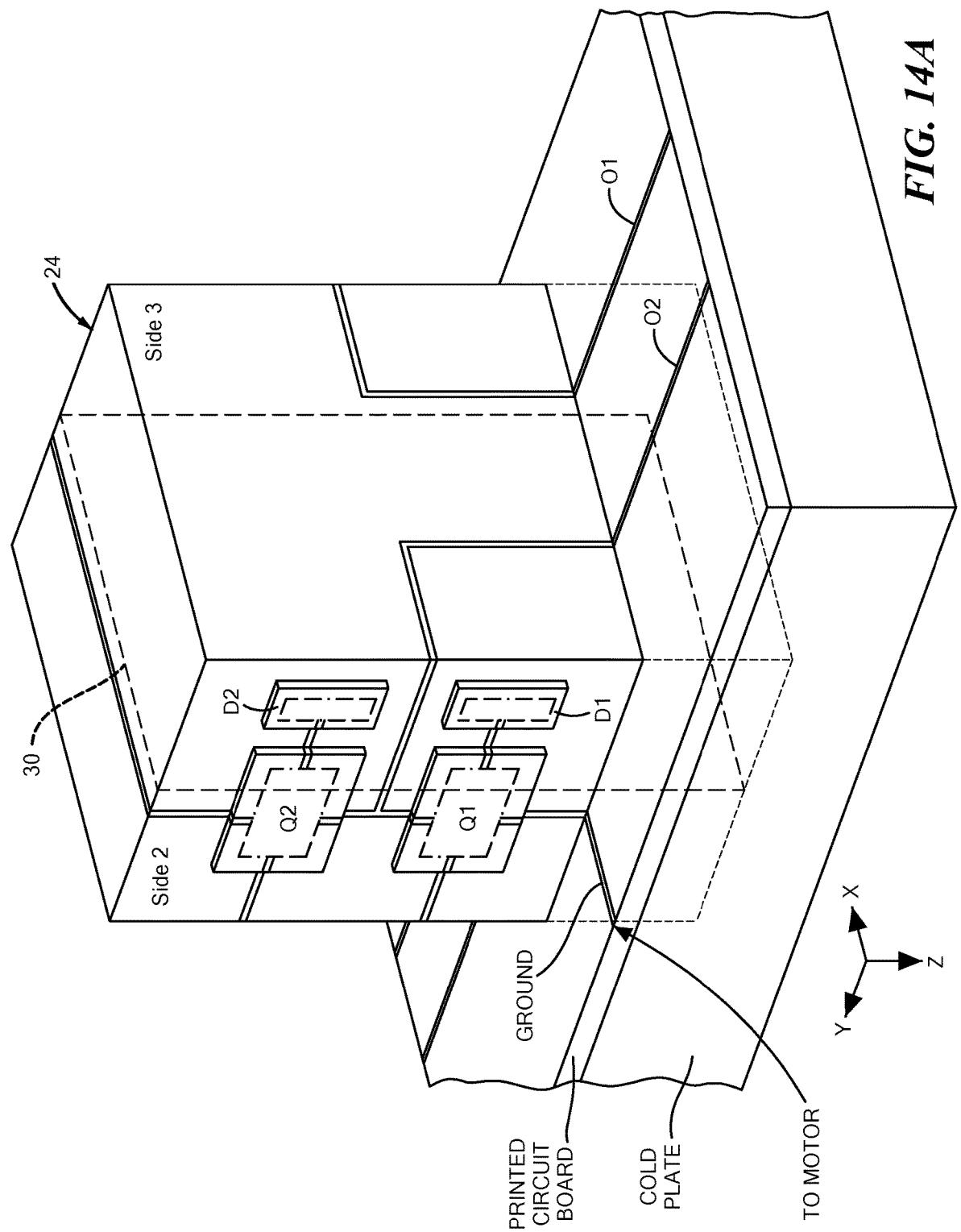
FIGS. 14A and 14B are simplified, diagrammatical, perspective sketches of a cooling structure according to the disclosure.
Figure 14B:
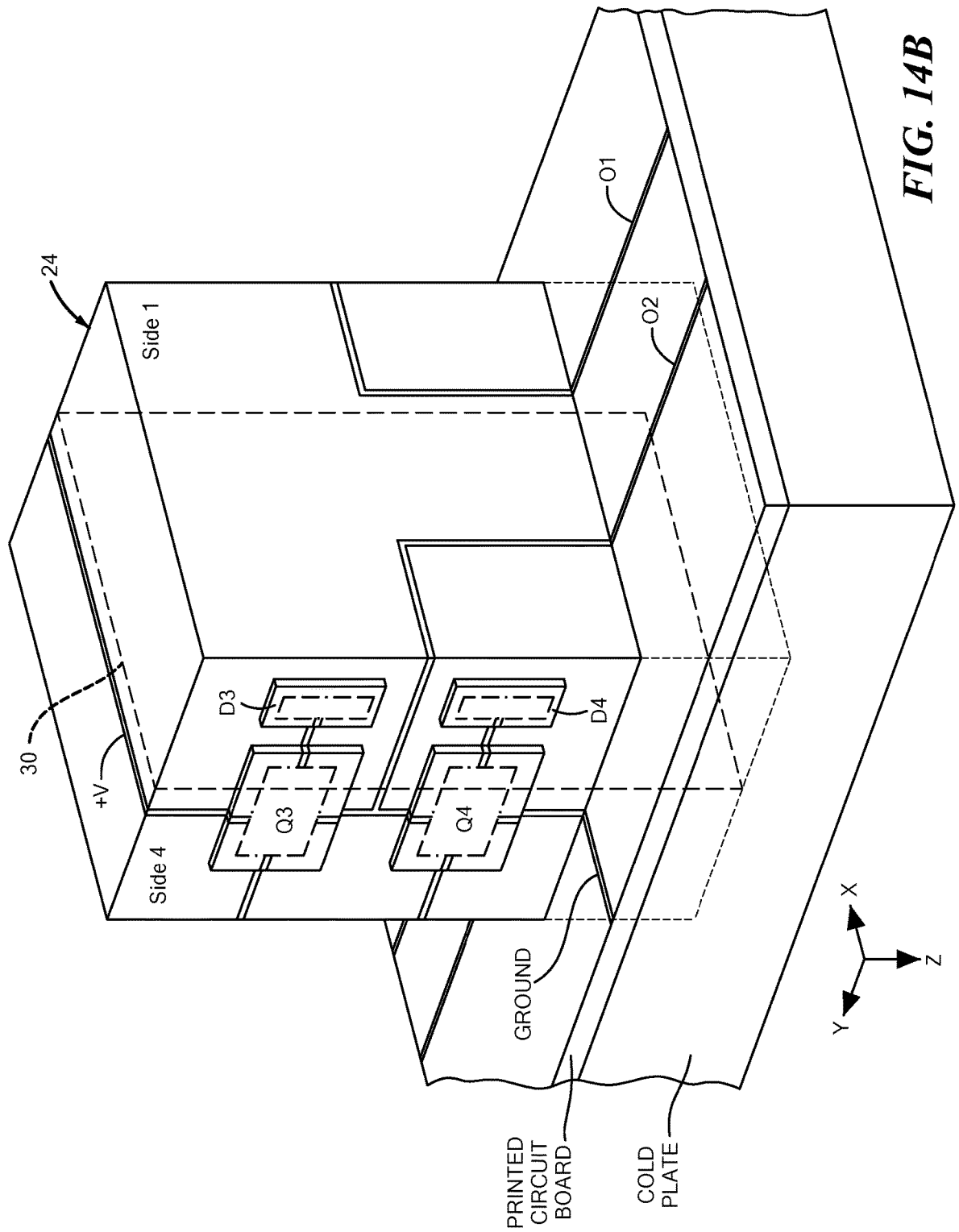

A number of embodiments of the disclosure have been described. Nevertheless, it will be understood that various modifications may be made without departing from the spirit and scope of the disclosure. For example, while the terminators 20a, 20b have been shown and described as being on sides 1 and 3, respectively, they may be on sides 2 and 4, respectively, and with transmission lines 17f and 17h, respectively having portions on sides 1 and 4, and sides 3 and 2, respectively. Still further the sides having the heat generating elements of the circuit need not be disposed in planes that are perpendicular (ninety degrees) to bottom surface of the substrate of the power MMIC amplifiers 12a, 12b but may be in planes that intersect the bottom surface of the substrate of the heat generating elements heat generating elements of the circuit at other angles than ninety degrees, such as, for example, 45 degrees or 30 degrees. Still further, while the splitter 14 and combiner 16 are described above as being individual passive components that are bonded to the heat spreader 24 they may be formed with strip conductors in the same manner as the transmissions lines on the dielectric material 71 formed over the portion of the surface of the heat spreader 24 where such splitter 14 and combiner 16 individual components are now located. Further, electrical interconnections between strip conductors on the heat spreader 24 and components on the heat spreader 24 may be made with ribbon or wire bonds. Further, the disclosure may be used with other applications than to splitting and combining networks and in power applications such as, for example, H-bridge designs, for example, see FIGS. 14, 14A and 14B where Metal Oxide Semiconductor Field Effect Transistors (MOSFETs) Q1-Q4 are connected to diodes D1-D4, as shown in FIG. 14. Here it is noted that the MOSFETs Q1-Q2 and diodes D1-D2 are bonded and thermally coupled to side 2 of the spreader 24 and that the MOSFETs Q3-Q4 and diodes D3-D3 are bonded and thermally coupled to opposite side 4 spreader 24, such sides 2 and 4 being perpendicular to the basal planes 30 of the spreader 24, FIG. 4, FIGS. 14, 14A and 14B.

Accordingly, other embodiments are within the scope of the following claims.

What is claimed is:

1. A cooling structure, comprising:
   a substrate having: a plurality of microwave transmission lines disposed on an upper surface of the substrate; and an opening passing through the substrate;
   a cold plate having a cavity formed in an upper surface of the cold plate, the upper surface being thermally coupled to a bottom surface of the substrate;
   a heat spreader comprising thermally anisotropic material, such material having anisotropic heat conducting properties for conducting heat therethrough along a preferred plane, the heat spreader having a lower portion passing through the opening onto a bottom surface of the cavity; and,
   a circuit, disposed on an upper portion of the heat spreader, the circuit comprising a plurality of heat generating electrical components disposed on different ones of a first portion of a plurality of surfaces of the heat spreader and interconnected by microwave transmission lines disposed on a second portion of the plurality of surfaces of the heat spreader, the preferred plane intersecting the first portion of a plurality of surfaces of the heat spreader.

2. The cooling structure recited in claim 1 wherein the thermally anisotropic material has a conductive material disposed on the plurality of surfaces.

3. The cooling structure recited in claim 2 wherein the conductive material provides a ground plane conductor for the microwave transmission lines.

4. The cooling structure recited in claim 3 wherein the heat generating electrical components have bottom surface thermally coupled and bonded to the conductive material.

5. The cooling structure recited in claim 1 wherein the substrate has an input microwaves transmission line and an output microwave transmission line and wherein the circuit is electrically connected to the input microwaves transmission line and an output microwave transmission line.

* * * * *